(12) United States Patent
Vrtis et al.

(10) Patent No.: US 9,061,317 B2
(45) Date of Patent: *Jun. 23, 2015

(54) POROGENS, POROGENATED PRECURSORS AND METHODS FOR USING THE SAME TO PROVIDE POROUS ORGANOSILICA GLASS FILMS WITH LOW DIELECTRIC CONSTANTS

(75) Inventors: Raymond Nicholas Vrtis, Orefield, PA (US); Mark Leonard O'Neill, Allentown, PA (US); Jean Louis Vincent, Bethlehem, PA (US); Aaron Scott Lukas, Washington, DC (US); Mary Kathryn Haas, Emmaus, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 496 days.

This patent is subject to a terminal disclaimer.

(21) Appl. No.: 13/439,911

(22) Filed: Apr. 5, 2012

(65) Prior Publication Data

US 2013/0095255 A1 Apr. 18, 2013

Related U.S. Application Data

(63) Continuation of application No. 12/115,087, filed on May 5, 2008, now abandoned, which is a continuation-in-part of application No. 10/409,468, filed on Apr. 7, 2003, now Pat. No. 7,384,471, which is (Continued)

(51) Int. Cl.
*C23C 16/30* (2006.01)
*B05D 1/00* (2006.01)

(Continued)

(52) U.S. Cl.
CPC . *B05D 1/62* (2013.01); *C23C 16/30* (2013.01); *C23C 16/401* (2013.01); *C23C 16/56* (2013.01);

(Continued)

(58) Field of Classification Search
CPC .. C23C 16/401; C23C 166/402; C23C 16/30; C23C 16/31; H01L 21/02214; H01L 21/34695; H01L 21/02126; H01L 21/02203; H01L 21/02208; H01L 21/02216; H01L 21/02274; H01L 21/02348
USPC ............... 106/287.1, 287.13, 287.14, 287.15; 257/E21.273; 427/255.29, 255.37, 532
See application file for complete search history.

(56) References Cited

U.S. PATENT DOCUMENTS

| 4,105,821 A | 8/1978 | Blaich et al. |
| 5,296,624 A | 3/1994 | Larson et al. |

(Continued)

FOREIGN PATENT DOCUMENTS

| EP | 1 037 275 A1 | 9/2000 |
| EP | 1077477 A1 | 2/2001 |

(Continued)

OTHER PUBLICATIONS

W.R. Robinson, "The Law of Patents for Useful Inventions"; 1890; p. 278.

(Continued)

*Primary Examiner* — David M Brunsman
(74) *Attorney, Agent, or Firm* — Rosaleen P. Morris-Oskanian

(57) ABSTRACT

A chemical vapor deposition method for producing a porous organosilica glass film comprising: introducing into a vacuum chamber gaseous reagents including at least one precursor selected from the group consisting of an organosilane and an organosiloxane, and a porogen that is distinct from the precursor, wherein the porogen is a $C_4$ to $C_{14}$ cyclic hydrocarbon compound having a non-branching structure and a degree of unsaturation equal to or less than 2; applying energy to the gaseous reagents in the vacuum chamber to induce reaction of the gaseous reagents to deposit a preliminary film on the substrate, wherein the preliminary film contains the porogen; and removing from the preliminary film substantially all of the labile organic material to provide the porous film with pores and a dielectric constant less than 2.6.

20 Claims, 11 Drawing Sheets

Related U.S. Application Data a continuation-in-part of application No. 10/150,798, filed on May 17, 2002, now Pat. No. 6,846,515.

(60) Provisional application No. 60/373,104, filed on Apr. 17, 2002.

(51) Int. Cl.
*C23C 16/40* (2006.01)
*C23C 16/56* (2006.01)
*H01L 21/02* (2006.01)
*C03C 3/04* (2006.01)
*C03C 11/00* (2006.01)

(52) U.S. Cl.
CPC .... *H01L 21/02126* (2013.01); *H01L 21/02203* (2013.01); *H01L 21/02208* (2013.01); *H01L 21/02216* (2013.01); *H01L 21/02274* (2013.01); *H01L 21/02348* (2013.01); *C03C 3/045* (2013.01); *C03C 11/00* (2013.01); *C03C 2201/12* (2013.01); *C03C 2201/21* (2013.01); *C03C 2201/80* (2013.01)

(56) References Cited

U.S. PATENT DOCUMENTS

| | | | |
|---|---|---|---|
| 6,054,206 | A | 4/2000 | Mountsier |
| 6,068,884 | A | 5/2000 | Rose et al. |
| 6,132,814 | A | 10/2000 | Livesay et al. |
| 6,171,945 | B1 | 1/2001 | Mandal et al. |
| 6,204,201 | B1 | 3/2001 | Ross |
| 6,207,555 | B1 | 3/2001 | Ross |
| 6,238,751 | B1 | 5/2001 | Mountsier |
| 6,312,793 | B1 | 11/2001 | Grill et al. |
| 6,387,824 | B1 | 5/2002 | Aoi |
| 6,583,048 | B1 | 6/2003 | Vincent et al. |
| 6,656,854 | B2 | 12/2003 | Miyano et al. |
| 6,716,770 | B2 | 4/2004 | O'Neill et al. |
| 6,790,789 | B2 | 9/2004 | Grill et al. |
| 6,846,515 | B2 * | 1/2005 | Vrtis et al. ............... 427/255.29 |
| 6,930,393 | B2 | 8/2005 | Hamada et al. |
| 7,049,247 | B2 | 5/2006 | Gates et al. |
| 7,056,560 | B2 | 6/2006 | Yim et al. |
| 7,332,445 | B2 | 2/2008 | Lukas et al. |
| 7,357,961 | B2 | 4/2008 | Iwabuchi et al. |
| 7,359,357 | B2 | 4/2008 | Rhee et al. |
| 7,384,471 | B2 | 6/2008 | Vrtis et al. |
| 7,404,990 | B2 * | 7/2008 | Lukas et al. .................. 427/553 |
| 7,468,290 | B2 | 12/2008 | Lukas et al. |
| 7,754,330 | B2 | 7/2010 | Hamada et al. |
| 7,943,195 | B2 * | 5/2011 | Vrtis et al. ............... 427/255.29 |
| 2002/0086109 | A1 | 7/2002 | Endo |
| 2002/0119676 | A1 | 8/2002 | Aoi |
| 2002/0142585 | A1 | 10/2002 | Mandal |
| 2003/0078443 | A1 | 4/2003 | Lee et al. |
| 2003/0211728 | A1 | 11/2003 | Mandal |
| 2003/0232137 | A1 | 12/2003 | Vrtis et al. |
| 2004/0102006 | A1 | 5/2004 | Xu et al. |
| 2004/0197474 | A1 | 10/2004 | Vrtis et al. |
| 2005/0048795 | A1 | 3/2005 | Ko et al. |
| 2006/0078676 | A1 | 4/2006 | Lukas et al. |
| 2007/0299239 | A1 | 12/2007 | Weigel et al. |
| 2011/0143032 | A1 | 6/2011 | Vrtis et al. |

FOREIGN PATENT DOCUMENTS

| | | |
|---|---|---|
| EP | 1 119 035 A2 | 7/2001 |
| EP | 1 225 194 A2 | 7/2002 |
| EP | 1482550 | 12/2004 |
| JP | 1990-0064931 | 3/1990 |
| JP | 03265585 A | 11/1991 |
| JP | 10-340899 A | 12/1998 |
| JP | 2011330069 | 11/1999 |
| JP | 2000-216153 A2 | 8/2000 |
| JP | 2000216153 A2 | 8/2000 |
| JP | 2000269208 | 9/2000 |
| JP | 2000349084 A2 | 12/2000 |
| JP | 2001-274153 | 10/2001 |
| JP | 2001-298023 A2 | 10/2001 |
| JP | 2001274153 A2 | 10/2001 |
| JP | 2003-040998 A2 | 4/2002 |
| JP | 2002-256434 A2 | 9/2002 |
| JP | 2004006822 A2 | 1/2004 |
| JP | 2004-534400 | 11/2004 |
| JP | 2004320005 A2 | 11/2004 |
| JP | 2007024479 A2 | 2/2007 |
| JP | 2008010877 A2 | 1/2008 |
| KR | 10-0494194 B1 | 6/2005 |
| TW | 540118 | 3/1990 |
| WO | 9850945 | 11/1998 |
| WO | 99/21706 A1 | 5/1999 |
| WO | 00/24050 A1 | 4/2000 |
| WO | 0111204 A1 | 2/2001 |
| WO | 200129052 A1 | 4/2001 |
| WO | 200211204 A1 | 2/2002 |
| WO | 200243119 A2 | 5/2002 |
| WO | 03/005429 A1 | 1/2003 |
| WO | 2004083495 | 9/2004 |
| WO | 2005019303 A1 | 3/2005 |
| WO | 2005109484 A1 | 11/2005 |
| WO | 2007033075 A9 | 3/2007 |

OTHER PUBLICATIONS

Grill, A., Ultralow-k dielectrics Prepared by Plasma-Enhanced Chemical Vapor Deposition, 2001 American Institute of Physics, Aug. 6, 2001, pp. 803-805, vol. 79, No. 6.

Chattopadhyay, S., Electron Beam Modification of Thermoplastic Elastomeric Blends Made From Polyolefins, Journal of Materials Science 36, 2001, pp. 4323-4330, Kluwer Academic Publishers.

Dixit, Girish, et al., "Film Properties and Integration Performance of a Nano-Porous Carbon Doped Oxide", Applied Materials, Inc., Santa Clara, California, USA, International Interconnect Technology Conference, Jun. 2004.

Grill, A., et al., "Novel Low-k dual-phase Materials Prepared by PECVD," Mat. Res. Soc. Symp. Proc. vol. 612, 2000 Materials Research Society, Yorktown Heights, NY.

Grill, A., et al., "SiOCH Dielectrics: From Low-K to Ultralow-K by PECVD," Conference Proceedings ULSI XVII, 2002 Materials Research Society, Yorktown Heights, NY.

Grill, A., et al., "Low Dielectric Constant SiCOH Films as Potential Candidates for Interconnect Dielectrics," Mat. Res. Soc. Symp. Proc., vol. 565, 1999 Materials Research Society, Yorktown Heights, NY.

Kloster, G., Porosity Effect on Low-k Dielectric Film Strength and Interfacial Adhesion, Proceedings of IITC, Jun. 3-5, 2002.

* cited by examiner

FT-IR signature of composite film, before porogen removal. Peak at 2930 is higher than that at 2960.

POROGENS, POROGENATED PRECURSORS AND METHODS FOR USING THE SAME TO PROVIDE POROUS ORGANOSILICA GLASS FILMS WITH LOW DIELECTRIC CONSTANTS

CROSS-REFERENCES TO RELATED APPLICATIONS

This application is a continuation application of U.S. patent application Ser. No. 12/115,087, filed May 5, 2008, which, in turn, is a continuation-in-part of U.S. patent application Ser. No. 10/409,468, filed on Apr. 7, 2003, now U.S. Pat. No. 7,384,471 which, in turn, is a continuation-in-part of U.S. patent application Ser. No. 10/150,798 filed May 17, 2002, now U.S. Pat. No. 6,846,515 which, in turn, claims priority under 35 U.S.C. §119(e) to provisional U.S. Patent Application No. 60/373,104 filed Apr. 17, 2002, the entire disclosures of which are incorporated herein by reference.

BACKGROUND OF THE INVENTION

The present invention is directed to the field of low dielectric constant materials produced by CVD methods. In particular, the present invention is directed to methods for making films of such materials and their use as insulating layers in electronic devices.

The electronics industry utilizes dielectric materials as insulating layers between circuits and components of integrated circuits (IC) and associated electronic devices. Line dimensions are being reduced in order to increase the speed and memory storage capability of microelectronic devices (e.g., computer chips). As the line dimensions decrease, the insulating requirements for the interlayer dielectric (ILD) become much more rigorous. Shrinking the spacing requires a lower dielectric constant to minimize the RC time constant, where R is the resistance of the conductive line and C is the capacitance of the insulating dielectric interlayer. The value of C is inversely proportional to spacing and proportional to the dielectric constant (k) of the interlayer dielectric (ILD). Conventional silica ($SiO_2$) CVD dielectric films produced from $SiH_4$ or TEOS ($Si(OCH_2CH_3)_4$, tetraethylorthosilicate) and $O_2$ have a dielectric constant k greater than 4.0. There are several ways in which the industry has attempted to produce silica-based CVD films with lower dielectric constants, the most successful being the doping of the insulating silicon oxide film with organic groups providing dielectric constants in the range of 2.7-3.5. This organosilica glass is typically deposited as a dense film (density 1.5 $g/cm^3$) from an organosilicon precursor, such as a methylsilane or siloxane, and an oxidant, such as $O_2$ or $N_2O$. Organosilica glass will herein be referred to as OSG. As dielectric constant or "k" values drop below 2.7 with higher device densities and smaller dimensions, the industry has exhausted most of the suitable low k compositions for dense films and has turned to various porous materials for improved insulating properties.

The patents and applications which are known in the field of porous ILD by CVD methods include: EP 1 119 035 A2 and U.S. Pat. No. 6,171,945, which describe a process of depositing an OSG film from organosilicon precursors with labile groups in the presence of an oxidant such as $N_2O$ and optionally a peroxide, with subsequent removal of the labile group with a thermal anneal to provide porous OSG; U.S. Pat. Nos. 6,054,206 and 6,238,751, which teach the removal of essentially all organic groups from deposited OSG with an oxidizing anneal to obtain porous inorganic $SiO_2$; EP 1 037 275, which describes the deposition of an hydrogenated silicon carbide film which is transformed into porous inorganic $SiO_2$ by a subsequent treatment with an oxidizing plasma; and U.S. Pat. No. 6,312,793 B1, WO 00/24050, and a literature article Grill, A. Patel, V. Appl. Phys. Lett. (2001), 79(6), pp. 803-805, which all teach the co-deposition of a film from an organosilicon precursor and an organic compound, and subsequent thermal anneal to provide a multiphase OSG/organic film in which a portion of the polymerized organic component is retained. In these latter references the ultimate final compositions of the films indicate residual porogen and a high hydrocarbon film content (80-90 atomic %). It is preferable that the final film retain the $SiO_2$-like network, with substitution of a portion of oxygen atoms for organic groups.

All references disclosed herein are incorporated by reference herein in their entireties.

BRIEF SUMMARY OF THE INVENTION

A chemical vapor deposition method for producing a porous organosilica glass film represented by the formula $Si_vO_wC_xH_yF_z$, where v+w+x+y+z=100%, v is from 10 to 35 atomic %, w is from 10 to 65 atomic %, x is from 5 to 30 atomic %, y is from 10 to 50 atomic % and z is from 0 to 15 atomic %, said method comprising: providing a substrate within a vacuum chamber; introducing into the vacuum chamber gaseous reagents including at least one precursor selected from the group consisting of an organosilane and an organosiloxane, and a porogen that is distinct from the precursor, wherein the porogen is a $C_4$ to $C_{14}$ cyclic hydrocarbon compound having a non-branching structure and a degree of unsaturation equal to or less than 2; applying energy to the gaseous reagents in the vacuum chamber to induce reaction of the gaseous reagents to deposit a preliminary film on the substrate, wherein the preliminary film contains the porogen; and removing from the preliminary film substantially all of the labile organic material to provide the porous film with pores and a dielectric constant less than 2.6.

In another aspect, the present invention provides a composition comprising: (i) at least one precursor selected from the group consisting of diethoxymethylsilane, dimethoxymethylsilane, di-isopropoxymethylsilane, di-t-butoxymethylsilane, methyltriethoxysilane, methyltrimethoxysilane, methyltri-isopropoxysilane, methyltri-t-butoxysilane, dimethyldimethoxysilane, dimethyldiethoxysilane, dimethyldi-isopropoxysilane, dimethyldi-t-butoxysilane, tetraethoxysilane, trimethylsilane, tetramethylsilane, methyltriacetoxysilane, methyldiacetoxysilane, methylethoxydisiloxane, tetramethylcyclotetrasiloxane, octamethylcyclotetrasiloxane, dimethyldiacetoxysilane, bis(trimethoxysilyl)methane, bis(dimethoxysilyl)methane, tetraethoxysilane, and triethoxysilane; and (ii) a porogen distinct from the at least one precursor, said porogen being a member selected from the group consisting of cyclooctene, cycloheptene, cyclooctane, cycloheptane, cyclohexane, and mixtures thereof.

$C_4$ to $C_{14}$ cyclic compounds having a non-branching structure and a degree of unsaturation equal to or less than 2 according to the present invention yield surprisingly superior mechanical properties in porous low dielectric films when employed as porogens.

DETAILED DESCRIPTION OF THE INVENTION

Figure 1:
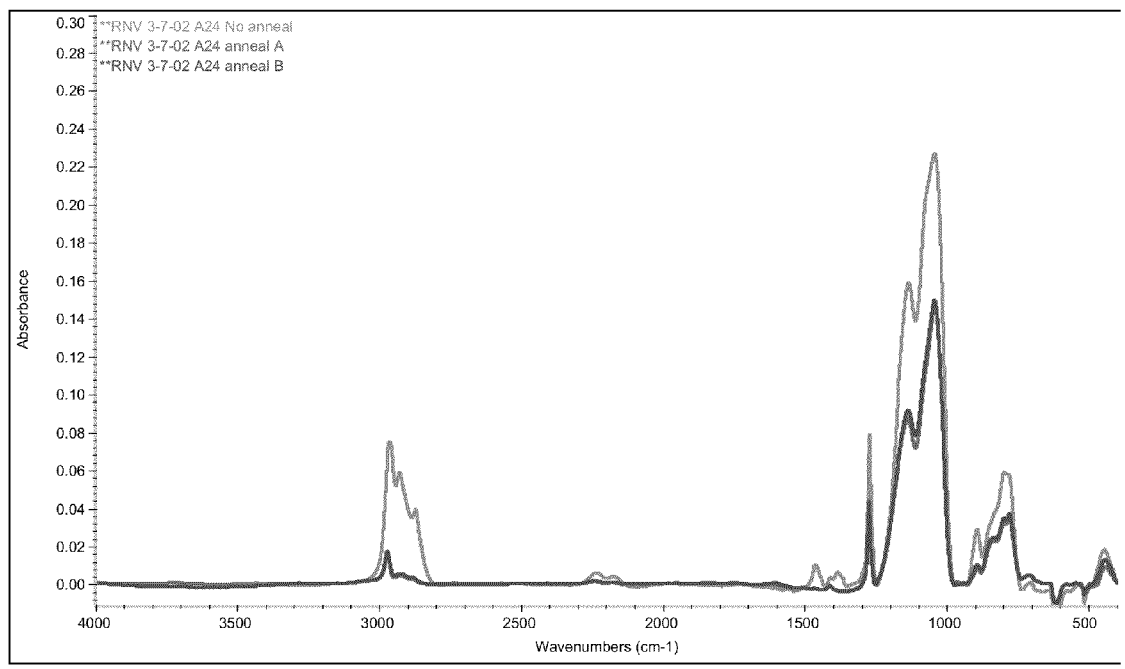
FIG. 1 shows infrared spectra of a film of the present invention using thermally labile group admixed therewith before and after a post anneal indicating the elimination of the thermally labile group.

Organosilicates are candidates for low k materials, but without the addition of porogens to add porosity to these materials, their inherent dielectric constant is limited to as low as 2.7. The addition of porosity, where the void space has an inherent dielectric constant of 1.0, reduces the overall dielectric constant of the film, generally at the cost of mechanical properties. Materials properties depend upon the chemical composition and structure of the film. Since the type of organosilicon precursor has a strong effect upon the film structure and composition, it is beneficial to use precursors that provide the required film properties to ensure that the addition of the needed amount of porosity to reach the desired dielectric constant does not produce films that are mechanically unsound. Thus, the invention provides the means to generate porous OSG films that have a desirable balance of electrical and mechanical properties. Other film properties often track with electrical or mechanical properties.

Preferred embodiments of the invention provide a thin film material having a low dielectric constant and improved mechanical properties, thermal stability, and chemical resistance (to oxygen, aqueous oxidizing environments, etc.) relative to other porous organosilica glass materials. This is the result of the incorporation into the film of carbon (preferably predominantly in the form of organic carbon, $-CH_x$, where x is 1 to 3, more preferably the majority of C is in the form of $-CH_3$) whereby specific precursor or network-forming chemicals are used to deposit films in an environment free of oxidants (other than the optional additive/carrier gas $CO_2$, to the extent it is deemed to function as an oxidant). It is also preferred that most of the hydrogen in the film is bonded to carbon.

Thus, preferred embodiments of the invention comprise: (a) about 10 to about 35 atomic %, more preferably about 20 to about 30% silicon; (b) about 10 to about 65 atomic %, more preferably about 20 to about 45 atomic % oxygen; (c) about 10 to about 50 atomic %, more preferably about 15 to about 40 atomic % hydrogen; (d) about 5 to about 30 atomic %, more preferably about 5 to about 20 atomic % carbon. Films may also contain about 0.1 to about 15 atomic %, more preferably about 0.5 to about 7.0 atomic % fluorine, to improve one or more of materials properties. Lesser portions of other elements may also be present in certain films of the invention. OSG materials are considered to be low k materials as their dielectric constant is less than that of the standard material traditionally used in the industry—silica glass. The materials of the invention can be provided by adding pore-forming species or porogens to the deposition procedure, incorporating the porogens into the as-deposited (i.e., preliminary) OSG film and removing substantially all of the porogens from the preliminary film while substantially retaining the terminal Si—$CH_3$ groups of the preliminary film to provide the product film. The product film is porous OSG and has a dielectric constant reduced from that of the preliminary film as well as from an analogous film deposited without porogens. It is important to distinguish the film of the present invention as porous OSG, as opposed to a porous inorganic $SiO_2$, which lacks the hydrophobicity provided by the organic groups in OSG.

Silica produced by PE-CVD TEOS has an inherent free volume pore size determined by positron annihilation lifetime spectroscopy (PALS) analysis to be about 0.6 nm in equivalent spherical diameter. The pore size of the inventive films as determined by small angle neutron scattering (SANS) or PALS is preferably less than 5 nm in equivalent spherical diameter, more preferably less than 2.5 nm in equivalent spherical diameter.

Total porosity of the film may be from 5 to 75% depending upon the process conditions and the desired final film properties. Films of the invention preferably have a density of less than 2.0 $g/cm^3$, or alternatively, less than 1.5 $g/cm^3$ or less than 1.25 $g/cm^3$. Preferably, films of the invention have a density at least 10% less than that of an analogous OSG film produced without porogens, more preferably at least 20% less.

The porosity of the film need not be homogeneous throughout the film. In certain embodiments, there is a porosity gradient and/or layers of varying porosities. Such films can be provided by, e.g., adjusting the ratio of porogen to precursor during deposition.

Films of the invention have a lower dielectric constant relative to common OSG materials. Preferably, films of the invention have a dielectric constant at least 0.3 less than that of an analogous OSG film produced without porogens, more preferably at least 0.5 less. Preferably a Fourier transform infrared (FTIR) spectrum of a porous film of the invention is substantially identical to a reference FTIR of a reference film prepared by a process substantially identical to the method except for a lack of any porogen.

Films of the invention preferably have superior mechanical properties relative to common OSG materials. Preferably, the base OSG structure of the films of the invention (e.g., films that have not had any added porogen) has a hardness or modulus measured by nanoindentation at least 10% greater, more preferably 25% greater, than that of an analogous OSG film at the same dielectric constant.

Films of the invention do not require the use of an oxidant to deposit a low k film. The absence of added oxidant to the gas phase, which is defined for present purposes as a moiety that could oxidize organic groups (e.g., $O_2$, $N_2O$, ozone, hydrogen peroxide, NO, $NO_2$, $N_2O_4$, or mixtures thereof), facilitates the retention of the methyl groups of the precursor in the film. This allows the incorporation of the minimum amount of carbon necessary to provide desired properties, such as reduced dielectric constant and hydrophobicity. As well, this tends to provide maximum retention of the silica network, providing films that have superior mechanical properties, adhesion, and etch selectivity to common etch stop materials (e.g., silicon carbide, hydrogenated silicon carbide, silicon nitride, hydrogenated silicon nitride, etc.), since the film retains characteristics more similar to silica, the traditional dielectric insulator.

Films of the invention may also optionally contain fluorine, in the form of inorganic fluorine (e.g., Si—F). Fluorine, when present, is preferably contained in an amount ranging from 0.5 to 7 atomic %.

Films of the invention are thermally stable, with good chemical resistance. In particular, preferred films after anneal have an average weight loss of less than 1.0 wt %/hr isothermal at 425° C. under $N_2$. Moreover, the films preferably have an average weight loss of less than 1.0 wt %/hr isothermal at 425° C. under air.

The films are suitable for a variety of uses. The films are particularly suitable for deposition on a semiconductor substrate, and are particularly suitable for use as, e.g., an insulation layer, an interlayer dielectric layer and/or an intermetal dielectric layer. The films can form a conformal coating. The mechanical properties exhibited by these films make them particularly suitable for use in Al subtractive technology and Cu damascene or dual damascene technology.

The films are compatible with chemical mechanical planarization (CMP) and anisotropic etching, and are capable of adhering to a variety of materials, such as silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, organic polymers, porous organic and inorganic materials, metals such as copper and aluminum, and diffusion barrier layers such as but not limited to TiN, Ti(C)N, TaN, Ta(C)N, Ta, W, WN or W(C)N. The films are preferably capable of adhering to at least one of the foregoing materials sufficiently to pass a conventional pull test, such as ASTM D3359-95a tape pull test. A sample is considered to have passed the test if there is no discernible removal of film.

Thus in certain embodiments, the film is an insulation layer, an interlayer dielectric layer, an intermetal dielectric layer, a capping layer, a chemical-mechanical planarization or etch stop layer, a barrier layer or an adhesion layer in an integrated circuit.

Although the invention is particularly suitable for providing films and products of the invention are largely described herein as films, the invention is not limited thereto. Products of the invention can be provided in any form capable of being deposited by CVD, such as coatings, multilaminar assemblies, and other types of objects that are not necessarily planar or thin, and a multitude of objects not necessarily used in integrated circuits. Preferably, the substrate is a semiconductor.

In addition to the inventive OSG products, the present invention includes the process by which the products are made, methods of using the products and compounds and compositions useful for preparing the products.

The porogen in the deposited film may or may not be in the same form as the porogens precursor introduced to the reaction chamber. As well, the porogen removal process may liberate the porogen or fragments thereof from the film. In essence, the porogen reagent, the porogen in the preliminary film, and the porogen being removed may or may not be the same species, although it is preferable that they all originate from the porogen reagent. Regardless of whether or not the porogen is unchanged throughout the inventive process, the term "porogen" as used herein is intended to encompass pore-forming reagents and derivatives thereof, in whatever forms they are found throughout the entire process of the invention.

Although the phrase "gaseous reagents" is sometimes used herein to describe the reagents, the phrase is intended to encompass reagents delivered directly as a gas to the reactor, delivered as a vaporized liquid, a sublimed solid and/or transported by an inert carrier gas into the reactor.

In addition, the reagents can be carried into the reactor separately from distinct sources or as a mixture. The reagents can be delivered to the reactor system by any number of means, preferably using a pressurizable stainless steel vessel fitted with the proper valves and fittings to allow the delivery of liquid to the process reactor.

In certain embodiments, mixtures of different organosilanes and/or organosiloxanes are used in combination. It is also within the scope of the invention to use combinations of multiple different porogens and organosilanes. Such embodiments facilitate adjusting the ratio of pores to Si in the final product, and/or enhance one or more critical properties of the base OSG structure. For example, a deposition utilizing diethoxymethylsilane (DEMS) and porogen might use an additional organosilicon such as tetraethoxysilane (TEOS) to improve the film mechanical strength.

In addition to the structure forming species and the pore-forming species, additional materials can be charged into the vacuum chamber prior to, during and/or after the deposition reaction. Such materials include, e.g., inert gas (e.g., He, Ar, $N_2$, Kr, Xe, etc., which may be employed as a carrier gas for lesser volatile precursors and/or which can promote the curing of the as-deposited materials and provide a more stable final film) and reactive substances, such as gaseous or liquid organic substances, $NH_3$, $H_2$, $CO_2$, or CO. $CO_2$ is the preferred carrier gas. Oxidizing gases such as, for example, $O_2$, $N_2O$, NO, $NO_2$ and $O_3$ may also be added.

Energy is applied to the gaseous reagents to induce the gases to react and to form the film on the substrate. Such energy can be provided by, e.g., thermal, plasma, pulsed plasma, helicon plasma, high density plasma, inductively coupled plasma, and remote plasma methods. A secondary rf frequency source can be used to modify the plasma characteristics at the substrate surface. Preferably, the film is formed by plasma enhanced chemical vapor deposition. It is particularly preferred to generate a capacitively coupled plasma at a frequency of 13.56 MHz. Plasma power is preferably from 0.02 to 7 watts/cm$^2$, more preferably 0.3 to 3 watts/cm$^2$, based upon a surface area of the substrate. It may be advantageous to employ a carrier gas which possesses a low ionization energy to lower the electron temperature in the plasma which in turn will cause less fragmentation in the OSG precursor and porogen. Examples of this type of low ionization gas include $CO_2$, $NH_3$, CO, $CH_4$, Ar, Xe, and Kr.

The flow rate for each of the gaseous reagents preferably ranges from 10 to 5000 sccm, more preferably from 30 to 1000 sccm, per single 200 mm wafer. The individual rates are selected so as to provide the desired amounts of structure-former and pore-former in the film. The actual flow rates needed may depend upon wafer size and chamber configuration, and are in no way limited to 200 mm wafers or single wafer chambers.

It is preferred to deposit the film at a deposition rate of at least 50 nm/min.

The pressure in the vacuum chamber during deposition is preferably 0.01 to 600 torr, more preferably 1 to 15 torr.

The film is preferably deposited to a thickness of 0.002 to 10 microns, although the thickness can be varied as required. The blanket film deposited on a non-patterned surface has excellent uniformity, with a variation in thickness of less than 2% over 1 standard deviation across the substrate with a reasonable edge exclusion, wherein e.g., a 5 mm outermost edge of the substrate is not included in the statistical calculation of uniformity.

The porosity of the film can be increased with the bulk density being correspondingly decreased to cause further reduction in the dielectric constant of the material and extending the applicability of this material to future generations (e.g., k<2.0).

The removal of substantially all porogen is assumed if there is no statistically significant measured difference in atomic composition between the annealed porous OSG and the analogous OSG without added porogen. The inherent measurement error of the analysis method for composition (e.g., X-ray photoelectron spectroscopy (XPS), Rutherford Backscattering/Hydrogen Forward Scattering (RBS/HFS)) and process variability both contribute to the range of the data. For XPS the inherent measurement error is Approx. +/−2 atomic %, while for RBS/HFS this is expected to be larger, ranging from +/−2 to 5 atomic % depending upon the species. The process variability will contribute a further +/−2 atomic % to the final range of the data.

The following are non-limiting examples of Si-based precursors suitable for use with a distinct porogen according to the present invention. In the chemical formulas which follow and in all chemical formulas throughout this document, the term "independently" should be understood to denote that the subject R group is not only independently selected relative to other R groups bearing different superscripts, but is also independently selected relative to any additional species of the same R group. For example, in the formula $R^1_n(OR^2)_{4-n}Si$, when n is 2 or 3, the two or three $R^1$ groups need not be identical to each other or to $R^2$.

$R^1_n(OR^2)_{3-n}Si$ where $R^1$ can be independently H, $C_1$ to $C_4$, linear or branched, saturated, singly or multiply unsaturated, cyclic, partially or fully fluorinated; $R^2$ can be independently $C_1$ to $C_6$, linear or branched, saturated, singly or multiply unsaturated, cyclic, aromatic, partially or fully fluorinated, n is 1 to 3.

Example: diethoxymethylsilane, dimethyldimethoxysilane $R^1_n(OR^2)_{3-n}Si—O—SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,3-dimethyl-1,3-diethoxydisiloxane $R^1_n(OR^2)_{3-n}Si—SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated, $R^2$ and $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,2-dimethyl-1,1,2,2-tetraethoxydisilane $R^1_n(O(O)CR^2)_{4-n}Si$ where $R^1$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated, n is 1 to 3.

Example: dimethyldiacetoxysilane $R^1_n(O(O)CR^2)_{3-n}Si—O—SiR^3_m(O(O)CR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently H, $C_1$ to $C_6$, linear or branched, saturated, singly or multiply unsaturated, cyclic, aromatic, partially or fully fluorinated, n is 1 to 3 and m is 1 to 3.

Example: 1,3-dimethyl-1,3-diacetoxydisiloxane $R^1_n(O(O)CR^2)_{3-n}Si—SiR^3_m(O(O)CR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently H, $C_1$ to $C_6$, linear or branched, saturated, singly or multiply unsaturated, cyclic, aromatic, partially or fully fluorinated, n is 1 to 3 and m is 1 to 3.

Example: 1,2-dimethyl-1,1,2,2-tetraacetoxydisilane $R^1_n(O(O)CR^2)_{3-n}Si—O—SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated, $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,3-dimethyl-1-acetoxy-3-ethoxydisiloxane $R^1_n(O(O)CR^2)_{3-n}Si—SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated and $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,2-dimethyl-1-acetoxy-2-ethoxydisilane $R^1_n(OR^2)_p(O(O)CR^4)_{4-(n+p)}Si$ where $R^1$ can be independently H, $C_1$ to $C_4$, linear or branched, saturated, singly or multiply unsaturated, cyclic, partially or fully fluorinated, $R^2$ can be independently $C_1$ to $C_6$, linear or branched, saturated, singly or multiply unsaturated, cyclic, aromatic, partially or fully fluorinated and $R^4$ can be independently H, $C_1$ to $C_6$, linear or branched, saturated, singly or multiply unsaturated, cyclic, aromatic, partially or fully fluorinated, and n is 1 to 3 and p is 1 to 3.

Example: methylacetoxy-t-butoxysilane $R^1_n(OR^2)_p(O(O)CR^4)_{3-n-p}Si—O—SiR^3_m(O(O)CR^5)_q(OR^6)_{3-m-q}$ where $R^1$ and $R^3$ can be independently H, $C_1$ to $C_4$, linear or branched, saturated, singly or multiply unsaturated, cyclic, partially or fully fluorinated; $R^2$ and $R^6$ can be independently $C_1$ to $C_6$, linear or branched, saturated, singly or multiply unsaturated, cyclic, aromatic, partially or fully fluorinated, $R^4$ and $R^5$ can be independently H, $C_1$ to $C_6$, linear or branched, saturated, singly or multiply unsaturated, cyclic, aromatic, partially or fully fluorinated, n is 1 to 3, m is 1 to 3, p is 1 to 3 and q is 1 to 3.

Example:
1,3-dimethyl-1,3-diacetoxy-1,3-diethoxydisiloxane $R^1_n(OR^2)_p(O(O)CR^4)_{3-n-p}Si—SiR^3_m(O(O)CR^5)_q(OR^6)_{3-m-q}$ where $R^1$ and $R^3$ can be independently H, $C_1$ to $C_4$, linear or branched, saturated, singly or multiply unsaturated, cyclic, partially or fully fluorinated; $R^2$, $R^6$ can be independently $C_1$ to $C_6$, linear or branched, saturated, singly or multiply unsaturated, cyclic, aromatic, partially or fully fluorinated, $R^4$, $R^5$ can be independently H, $C_1$ to $C_6$, linear or branched, saturated, singly or multiply unsaturated, cyclic, aromatic, partially or fully fluorinated, n is 1 to 3, m is 1 to 3, p is 1 to 3 and q is 1 to 3.

Example:
1,2-dimethyl-1,2-diacetoxy-1,2-diethoxydisilane cyclic siloxanes of the formula $(OSiR_1R_3)_x$, where $R^1$ and $R^3$ can be independently H, $C_1$ to $C_4$, linear or branched, saturated, singly or multiply unsaturated, cyclic, partially or fully fluorinated, and x may be any integer from 2 to 8.

Examples: 1,3,5,7-tetramethylcyclotetrasiloxane, octamethylcyclotetrasiloxane

Provisos to all above precursor groups: 1) a porogen is added to the reaction mixture, and 2) a curing (e.g., anneal) step is used to remove substantially all of the included porogen from the deposited film to produce a k<2.6.

The above precursors may be mixed with porogen or have attached porogens, and may be mixed with other molecules of these classes and/or with molecules of the same classes except where n and /or m are from 0 to 3.

Examples: TEOS, triethoxysilane,
di-tertiarybutoxysilane, silane, disilane,
di-tertiarybutoxydiacetoxysilane, etc.

The following are additional formulas representing certain Si-based precursors suitable for use with a distinct porogen according to the present invention:

(a) the formula $R^1_n(OR^2)_p(O(O)CR^3)_{4-(n+p)}Si$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3 and p is 0 to 3;

(b) the formula $R^1_n(OR^2)_p(O(O)CR^4)_{3-n-p}Si—O—SiR^3_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≥1, n+p≤3 and m+q≤3;

(c) the formula $R^1_n(OR^2)_p(O(O)CR^4)_{3-n-p}Si—SiR^3_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≥1, n+p≤3 and m+q≤3;

(d) the formula $R^1_n(OR^2)_p(O(O)CR^4)_{3-n-p}Si—R^7—SiR^3_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$, $R^6$ and $R^7$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≥1, n+p≤3, and m+q≤3;

(e) the formula $(R^1_n(OR^2)_p(O(O)CR^3)_{4-(n+p)}Si)_tCH_{4-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3, and t is 2 to 4, provided that n+p≤4;

(f) the formula $(R^1_n(OR^2)_p(O(O)CR^3)_{4-(n+p)}Si)_tNH_{3-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3 and t is 1 to 3, provided that n+p≤4;

(g) cyclic siloxanes of the formula $(OSiR_1R_3)_x$, where $R^1$ and $R^3$ are independently H, $C_1$ to $C_4$, linear or branched, saturated, singly or multiply unsaturated, cyclic, partially or fully fluorinated, and x may be any integer from 2 to 8;

(h) cyclic silazanes of the formula $(NR_1SiR_1R_3)_x$, where $R^1$ and $R^3$ are independently H, $C_1$ to $C_4$, linear or branched, saturated, singly or multiply unsaturated, cyclic, partially or fully fluorinated, and x may be any integer from 2 to 8; and (i) cyclic carbosilanes of the formula $(CR_1R_3SiR_1R_3)_x$, where $R^1$ and $R^3$ are independently H, $C_1$ to $C_4$, linear or branched, saturated, singly or multiply unsaturated, cyclic, partially or fully fluorinated, and x may be any integer from 2 to 8.

Although reference is made throughout the specification to siloxanes and disiloxanes as precursors and porogenated precursors, it should be understood that the invention is not limited thereto, and that other siloxanes, such as trisiloxanes and other linear siloxanes of even greater length, are also within the scope of the invention.

The above precursors may be mixed with other molecules of these same classes and/or with molecules of the same classes except where n and/or m are from 0 to 3.

The following are non-limiting examples of materials suitable for use as porogens according to the present invention:

1) Cyclic hydrocarbons of the general formula $C_nH_{2n}$ where n=4-14, where the number of carbons in the cyclic structure is between 4 and 10, and where there can be a plurality of simple or branched hydrocarbons substituted onto the cyclic structure.

Examples include: cyclohexane,
trimethylcyclohexane,
1-methyl-4(1-methylethyl)cyclohexane, cyclooctane,
methylcyclooctane, etc.

2) Linear or branched, saturated, singly or multiply unsaturated hydrocarbons of the general formula $C_nH_{(2n+2)2y}$ where n=2-20 and where y=0-n.

Examples include: ethylene, propylene, acetylene,
neohexane, etc.

3) Singly or multiply unsaturated cyclic hydrocarbons of the general formula $C_nH_{2n-2x}$ where x is the number of unsaturated sites in the molecule, n=4-14, where the number of carbons in the cyclic structure is between 4 and 10, and where there can be a plurality of simple or branched hydrocarbons substituted onto the cyclic structure. The unsaturation can be located inside endocyclic or on one of the hydrocarbon substituents to the cyclic structure.

Examples include cyclohexene, vinylcyclohexane,
dimethylcyclohexene, t-butylcyclohexene,
alpha-terpinene, pinene,
1,5-dimethyl-1,5-cyclooctadiene, vinyl-cyclohexene,
etc.

4) Bicyclic hydrocarbons of the general formula $C_nH_{2n-2}$ where n=4-14, where the number of carbons in the bicyclic structure is between 4 and 12, and where there can be a plurality of simple or branched hydrocarbons substituted onto the cyclic structure.

Examples include, norbornane, spiro-nonane,
decahydronaphthalene, etc.

5) Multiply unsaturated bicyclic hydrocarbons of the general formula $C_nH_{2n-(2+2x)}$ where x is the number of unsaturated sites in the molecule, n=4-14, where the number of carbons in the bicyclic structure is between 4 and 12, and where there can be a plurality of simple or branched hydrocarbons substituted onto the cyclic structure. The unsaturation can be located inside endocyclic or on one of the hydrocarbon substituents to the cyclic structure.

Examples include camphene, norbornene,
norbornadiene, etc.

6) Tricyclic hydrocarbons of the general formula $C_nH_{2n-4}$ where n=4-14, where the number of carbons in the tricyclic structure is between 4 and 12, and where there can be a plurality of simple or branched hydrocarbons substituted onto the cyclic structure.

An example includes adamantane.

Particularly preferred porogens according to the present invention include $C_4$ to $C_{14}$ cyclic hydrocarbon compounds. More preferably, the $C_4$ to $C_{14}$ cyclic hydrocarbon compounds have a non-branched structure. Most preferably, the $C_4$ to $C_{14}$ cyclic hydrocarbon compounds are non-branched and have a degree of un-saturation equal to or less than 2. The degree of un-saturation is defined as $n_C-n_H/2+1$, where $n_C$ and $n_H$ are the number of carbon and hydrogen atoms in the molecule, respectively. As used herein, the term "non-branched" refers to structures that are free of terminal pendant groups and does not exclude multicyclic compounds.

Of the particularly preferred porogens according to the present invention, more preferred porogens include (1) $C_7$ to $C_{10}$ cyclic hydrocarbon compounds that are non-branched such as, for example, cyclooctadiene, norbornadiene and mixtures thereof; and (2) $C_7$ to $C_{10}$ cyclic hydrocarbon compounds that are non-branched and have a degree of un-saturation equal to or less than 2 such as, for example, cyclooctane, cycloheptane, cyclooctene, cycloheptene, and mixtures thereof. Applicants have surprisingly discovered that employing the particularly preferred porogens according to the present invention results in at least two advantages.

The first is that optimal mechanical properties of the dielectric film typically result when a cyclic hydrogen with low degree of un-saturation is employed as the porogens precursor. Particularly preferred porogens according to the present invention enable the formation of robust organosilicate networks in the porous film. In this regard, employing as a porogen precursor, for example, a $C_7$ to $C_{10}$ cyclic hydrocarbon compound with no branching and a degree of un-saturation equal to or less than 2 can provide lower silicon-methyl incorporation in the porous film. The ratio of this Si—CH$_3$/Si—O species is a measure of the network connectivity of the film, and has been shown to be directly related to the film modulus. Without intending to be bound by a particular theory, a cyclic hydrocarbon porogen precursor with more saturation typically has a higher ionization energy in the plasma, which is more closely matched to the OSG precursor. It is believed that this allows more fragmentation of the organosilane precursor, which ultimately leads to lower methyl incorporation into the OSG network.

Another benefit of employing the particularly preferred cyclic hydrocarbon compounds according to the present invention as porogen precursors is the nature of the organic porogen material that is deposited in the composite film. Without wishing to be bound by a particular theory, it is believed that the polyethylene-like organic material that is deposited from cyclic, preferably non-branching porogen precursors such as, for example, cyclooctane, may be easier to remove from the film and result in less build up of absorptive residues inside the curing chamber. This may reduce the time needed to clean the chamber and improve overall throughput.

For example, the particularly preferred porogens according to the present invention are removed from the OSG composite most commonly by UV exposure though a transparent window. As the labile porogen material is removed by UV exposure, some portion of it deposits on the transparent window and blocks the required UV wavelengths. Therefore, efficiency of the curing process and throughput of UV chamber cleaning are dependent on the amount and type of absorptive species that deposit on the window. Removal of the particularly preferred porogens typically results in less blockage of the UV signal than does, for example, limonene, thereby typically reducing the time necessary to clean the chamber. Without wishing to be bound by a particular theory, it is believed that employing as a porogen a cyclic, preferably non-branching hydrocarbon compound results in the formation of a higher concentration of polymer chain propagating species and less polymer chain terminating species during plasma polymerization and, therefore, a more polyethylene-like organic material that incorporates efficiently into the composite film. In contrast, a branched porogen such as alpha-terpinene may fragment into terminating methyl and propyl groups during plasma polymerization, producing a less desired organic material in the composite film that is less efficiently incorporated into the as-deposited film, less efficiently removed from the film, and less efficiently cleaned from the deposition and cure chambers. These advantages are illustrated in the Example section below.

The invention further provides compositions to be employed according to the claimed methods of the present invention. A composition according to the present invention preferably comprises:

(A) (1) at least one precursor selected from the group consisting of:

(a) the formula $R^1{}_n(OR^2)_p(O(O)CR^3)_{4-(n+p)}Si$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3 and p is 0 to 3;

(b) the formula $R^1{}_n(OR^2)_p(O(O)CR^4)_{3-n-p}Si-O-SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≥1, n+p≤3 and m+q≤3;

(c) the formula $R^1{}_n(OR^2)_p(O(O)CR^4)_{3-n-p}Si-SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≥1, n+p≤3 and m+q≤3;

(d) the formula $R^1{}_n(OR^2)_p(O(O)CR^4)_{3-n-p}Si-R^7-SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$, $R^6$ and $R^7$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≥1, n+p≤3, and m+q≤3;

(e) the formula $(R^1{}_n(OR^2)_p(O(O)CR^3)_{4-(n+p)}Si)_tCH_{4-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3, and t is 2 to 4, provided that n+p≤4;

(f) the formula $(R^1{}_n(OR^2)_p(O(O)CR^3)_{4-(n+p)}Si)_tNH_{3-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3 and t is 1 to 3, provided that n+p≤4;

(g) cyclic siloxanes of the formula $(OSiR_1R_3)_x$, where $R^1$ and $R^3$ are independently H, $C_1$ to $C_4$, linear or branched, saturated, singly or multiply unsaturated, cyclic, partially or fully fluorinated, and x may be any integer from 2 to 8;

(h) cyclic silazanes of the formula $(NR_1SiR_1R_3)_x$, where $R^1$ and $R^3$ are independently H, $C_1$ to $C_4$, linear or branched, saturated, singly or multiply unsaturated, cyclic, partially or fully fluorinated, and x may be any integer from 2 to 8; and (i) cyclic carbosilanes of the formula $(CR_1R_3SiR_1R_3)_x$, where $R^1$ and $R^3$ are independently H, $C_1$ to $C_4$, linear or branched, saturated, singly or multiply unsaturated, cyclic, partially or fully fluorinated, and x may be any integer from 2 to 8, and (A) (2) a porogen distinct from the at least one precursor, said porogen being at least one of:

(a) at least one cyclic hydrocarbon compound having a cyclic structure and the formula $C_nH_{2n}$, where n is 4 to 14, a number of carbons in the cyclic structure is between 4 and 10, and the at least one cyclic hydrocarbon optionally contains a plurality of simple or branched hydrocarbons substituted onto the cyclic structure;

(b) at least one linear or branched, saturated, singly or multiply unsaturated hydrocarbon of the general formula $C_nH_{(2n+2)-2y}$ where n=2-20 and where y=0-n, (c) at least one singly or multiply unsaturated cyclic hydrocarbon having a cyclic structure and the formula $C_nH_{2n-2x}$, where x is a number of unsaturated sites, n is 4 to 14, a number of carbons in the cyclic structure is between 4 and 10, and the at least one singly or multiply unsaturated cyclic hydrocarbon optionally contains a plurality of simple or branched hydrocarbons substituents substituted onto the cyclic structure, and contains endocyclic unsaturation or unsaturation on one of the hydrocarbon substituents;

(d) at least one bicyclic hydrocarbon having a bicyclic structure and the formula $C_nH_{2n-2}$, where n is 4 to 14, a number of carbons in the bicyclic structure is from 4 to 12, and the at least one bicyclic hydrocarbon optionally contains a plurality of simple or branched hydrocarbons substituted onto the bicyclic structure;

(e) at least one multiply unsaturated bicyclic hydrocarbon having a bicyclic structure and the formula $C_nH_{2n-(2+2x)}$, where x is a number of unsaturated sites, n is 4 to 14, a number of carbons in the bicyclic structure is from 4 to 12, and the at least one multiply unsaturated bicyclic hydrocarbon optionally contains a plurality of simple or branched hydrocarbons substituents substituted onto the bicyclic structure, and contains endocyclic unsaturation or unsaturation on one of the hydrocarbon substituents; and/or (f) at least one tricyclic hydrocarbon having a tricyclic structure and the formula $C_nH_{2n-4}$, where n is 4 to 14, a number of carbons in the tricyclic structure is from 4 to 12, and the at least one tricyclic hydrocarbon optionally contains a plurality of simple or branched hydrocarbons substituted onto the cyclic structure.

In certain embodiments of the composition comprising a precursor, the composition preferably comprises: (a)(i) at least one precursor selected from the group consisting of diethoxymethylsilane, dimethoxymethylsilane, di-isopropoxymethylsilane, di-t-butoxymethylsilane, methyltriethoxysilane, methyltrimethoxysilane, methyltri-isopropoxysilane, methyltri-t-butoxysilane, dimethyldimethoxysilane, dimethyldiethoxysilane, dimethyldi-isopropoxysilane, dimethyldi-t-butoxysilane, 1,3,5,7-tetramethylcyclotatrasiloxane, octamethyl-cyclotetrasiloxane and tetraethoxysilane, and (ii) a porogen distinct from the at least one precursor, said porogen being a member selected from the group consisting of alpha-terpinene, limonene, cyclohexane, 1,2,4-trimethylcyclohexane, 1,5-dimethyl-1,5-cyclooctadiene, camphene, adamantane, 1,3-butadiene, substituted dienes and decahydronaphthelene; and/or (b)(i) at least one precursor selected from the group consisting of trimethylsilane, tetramethylsilane, diethoxymethylsilane, dimethoxymethylsilane, ditertiarybutoxymethylsilane, methyltriethoxysilane, dimethyldimethoxysilane, dimethyldiethoxysilane, methyltriacetoxysilane, methyldiacetoxysilane, methylethoxydisiloxane, tetramethylcyclotetrasiloxane, octamethylcyclotetrasiloxane, dimethyldiacetoxysilane, bis(trimethoxysilyl)methane, bis(dimethoxysilyl)methane, tetraethoxysilane and triethoxysilane, and (ii) alpha-terpinene, gamma-terpinene, limonene, dimethylhexadiene, ethylbenzene, decahydronaphthalene, 2-carene, 3-carene, vinylcyclohexene and dimethylcyclooctadiene.

In certain embodiments the composition preferably comprises: a composition comprising: (a)(i) at least one precursor selected from the group consisting of diethoxymethylsilane, dimethoxymethylsilane, di-isopropoxymethylsilane, di-t-butoxymethylsilane, methyltriethoxysilane, methyltrimethoxysilane, methyltri-isopropoxysilane, methyltri-t-butoxysilane, dimethyldimethoxysilane, dimethyldiethoxysilane, dimethyldi-isopropoxysilane, dimethyldi-t-butoxysilane, and tetraethoxysilane, trimethylsilane, tetramethylsilane, diethoxymethylsilane, dimethoxymethylsilane, ditertiarybutoxymethylsilane, methyltriethoxysilane, dimethyldimethoxysilane, dimethyldiethoxysilane, methyltriacetoxysilane, methyldiacetoxysilane, methylethoxydisiloxane, tetramethylcyclotetrasiloxane, octamethylcyclotetrasiloxane, dimethyldiacetoxysilane, bis(trimethoxysilyl)methane, bis(dimethoxysilyl)methane, tetraethoxysilane, triethoxysilane, 1,1,33-tetramethyl-1,3-disilacyclobutane; 1,1,3,3-tetraethoxy-1,3-disilacyclobutane, 1,3-dimethyl-1,3-diethoxy-1,3-disilacyclobutane, 1,3-diacetoxy-1,3-methyl-1,3-disilacyclobutane, 1,1,3,3-tetraacetoxy-1,3-disilacyclobutane, 1,3-disilabutane; 1,1,1,3,3,3-hexamethoxy-1,3-disilapropane, 1,1,1,3,3,3-hexaethoxy-1,3-disilapropane, 1,3-disilapropane; 1,1,1-tetramethoxy-1,3-disilapropane, 1,1,1,3,3,3-hexaacetoxy-1,3-disilapropane, 1,1,1-tetraethoxy-1,3-disilapropane; 1,3-disilacyclobutane, 1,3-diethoxy-1,3-disilabutane; 1,3-diethoxy-1-methyl-1,3-disilabutane, 1,1,3,3-tetraethoxy-1-methyl-1,3-disilabutane, 1,1,3,3-tetramethoxy-1-methyl-1,3-disilabutane, 1,1,3,3-tetraacetoxy-1-methyl-1,3-dilabutane and mixtures thereof; and (ii) a porogen distinct from the at least one precursor, said porogen being a member selected from the group consisting of cyclooctene, cycloheptene, cyclooctane, cyclooctadiene, cycloheptane, cycloheptadiene, cycloheptatriene, and mixtures thereof.

Compositions of the invention can further comprise, e.g., at least one pressurizable vessel (preferably of stainless steel) fitted with the proper valves and fittings to allow the delivery of porogen, non-porogenated precursor and/or porogenated precursor to the process reactor. The contents of the vessel(s) can be premixed. Alternatively, porogen and precursor can be maintained in separate vessels or in a single vessel having separation means for maintaining the porogen and precursor separate during storage. Such vessels can also have means for mixing the porogen and precursor when desired.

The porogen is removed from the preliminary (or as-deposited) film by a curing step, which can comprise thermal annealing, exposure to ultraviolet radiation, chemical treatment, in-situ or remote plasma treating, photocuring and/or microwaving. Other in-situ or post-deposition treatments may be used to enhance materials properties like hardness, stability (to shrinkage, to air exposure, to etching, to wet etching, etc.), integrity, uniformity and adhesion. Such treatments can be applied to the film prior to, during and/or after porogen removal using the same or different means used for porogen removal. Thus, the term "post-treating" as used herein denotes treating the film with energy (e.g., thermal, plasma, photon, electron, microwave, etc.) or chemicals to remove porogens and, optionally, to enhance materials properties.

The conditions under which post-treating are conducted can vary greatly. For example, post-treating can be conducted under high pressure or under a vacuum ambient.

Annealing is conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), etc.). The pressure is preferably about 1 Torr to about 1000 Torr, more preferably atmospheric pressure. However, a vacuum ambient is also possible for thermal annealing as well as any other post-treating means. The temperature is preferably 200-500° C., and the temperature ramp rate is from 0.1 to 100 deg ° C./min. The total annealing time is preferably from 0.01 min to 12 hours.

Chemical treatment of the OSG film is conducted under the following conditions.

The use of fluorinating (HF, $SIF_4$, $NF_3$, $F_2$, $COF_2$, $CO_2F_2$, etc.), oxidizing ($H_2O_2$, $O_3$, etc.), chemical drying, methylating, or other chemical treatments that enhance the properties of the final material. Chemicals used in such treatments can be in solid, liquid, gaseous and/or supercritical fluid states.

Supercritical fluid post-treatment for selective removal of porogens from an organosilicate film is conducted under the following conditions.

The fluid can be carbon dioxide, water, nitrous oxide, ethylene, $SF_6$, and/or other types of chemicals. Other chemicals can be added to the supercritical fluid to enhance the process. The chemicals can be inert (e.g., nitrogen, $CO_2$, noble gases (He, Ar, Ne, Kr, Xe), etc.), oxidizing (e.g., oxygen, ozone, nitrous oxide, etc.), or reducing (e.g., dilute or concentrated hydrocarbons, hydrogen, etc.). The temperature is preferably ambient to 500° C. The chemicals can also include larger chemical species such as surfactants. The total exposure time is preferably from 0.01 min to 12 hours.

Plasma treating for selective removal of labile groups and possible chemical modification of the OSG film is conducted under the following conditions.

The environment can be inert (nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrogen, hydrocarbons (saturated, unsaturated, linear or branched, aromatics), etc.). The plasma power is preferably 0-5000 W. The temperature is preferably ambient to 500° C. The pressure is preferably 10 mtorr to atmospheric pressure. The total curing time is preferably 0.01 min to 12 hours.

Photocuring for selective removal of porogens from an organosilicate film is conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power is preferably 0 to 5000 W. The wavelength is preferably IR, visible, UV or deep UV (wavelengths <200 nm). The total curing time is preferably 0.01 min to 12 hours.

Microwave post-treatment for selective removal of porogens from an organosilicate film is conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power and wavelengths are varied and tunable to specific bonds. The total curing time is preferably from 0.01 min to 12 hours.

Electron beam post-treatment for selective removal of porogens or specific chemical species from an organosilicate film and/or improvement of film properties is conducted under the following conditions.

The environment can be vacuum, inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The electron density and energy can be varied and tunable to specific bonds. The total curing time is preferably from 0.001 min to 12 hours, and may be continuous or pulsed. Additional guidance regarding the general use of electron beams is available in publications such as: S. Chattopadhyay et al., Journal of Materials Science, 36 (2001) 4323-4330; G. Kloster et al., Proceedings of IITC, Jun. 3-5, 2002, SF, CA; and U.S. Pat. Nos. 6,207,555 B1, 6,204,201 B1 and 6,132,814 A1. The use of electron beam treatment may provide for porogen removal and enhancement of film mechanical properties through bond-formation processes in matrix.

The invention will be illustrated in more detail with reference to the following Examples, but it should be understood that the present invention is not deemed to be limited thereto.

EXAMPLES

All experiments were performed on an Applied Materials Precision-5000 system in a 200 mm DxZ chamber fitted with an Advance Energy 2000 rf generator, using an undoped TEOS process kit. The recipe involved the following basic steps: initial set-up and stabilization of gas flows, deposition, and purge/evacuation of chamber prior to wafer removal. Films were annealed in a tube furnace at 425° C. for 4 hours under $N_2$.

Thickness and refractive index were measured on an SCI Filmtek 2000 Reflectometer. Dielectric constants were determined using Hg probe technique on low resistivity p-type wafers (<0.02 ohm-cm). Mechanical properties were determined using MTS Nano Indenter. Thermal stability and off-gas products were determined by thermogravimetric analysis on a Thermo TA Instruments 2050 TGA. Compositional data were obtained by x-ray photoelectron spectroscopy (XPS) on a Physical Electronics 5000LS. The atomic % values reported in the tables do not include hydrogen.

Three routes were chosen for introducing porosity into an OSG film. The first route investigated to produce low k films with k<2.6 co-deposited a thermally labile organic oligomer as the porogen along with the OSG by plasma enhanced chemical vapor deposition (PECVD) and then removed the oligomer post-deposition in a thermal annealing step.

Example 1A

Figure 4:
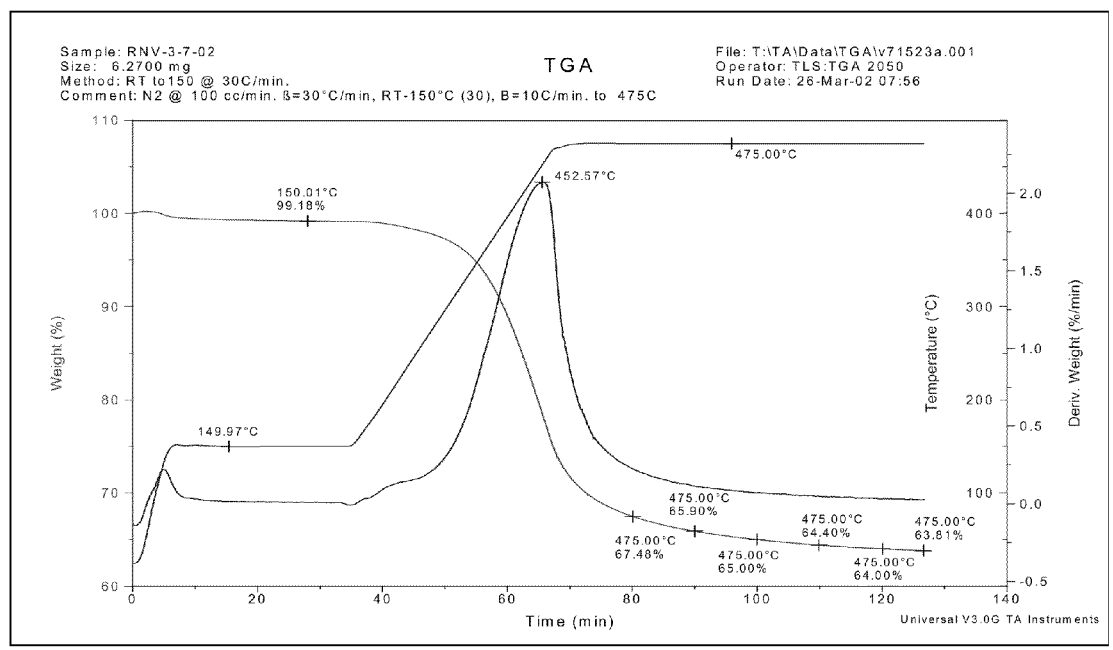
FIG. 4 is a thermogravimetric analysis of the film of the present invention during anneal indicating weight loss resulting from the loss of thermally labile group from the film.

Alpha-terpinene (ATP) was co-deposited with diethoxymethylsilane (DEMS) onto a silicon wafer via PECVD in an oxidant-free environment. The process conditions were 700 miligrams per minute (mgm) flow of a 39.4% (by volume) mixture of ATP in DEMS. A carrier gas flow of 500 sccm of $CO_2$ was used to escort the chemicals into the deposition chamber. Further process conditions were as follows: a chamber pressure of 5 Torr, wafer chuck temperature of 150° C., showerhead to wafers spacing of 0.26 inches, and plasma power of 300 watts for a period of 180 seconds. The film as deposited had a thickness of 650 nm and a dielectric constant of 2.8. The film was annealed at 425° C. under nitrogen for 4 hours to remove substantially all of the incorporated ATP, as evidenced by XPS. FIG. 1 shows infrared spectra of the film before (lighter line) and after (darker line) annealing, indicating the elimination of the porogen. The annealed film had a thickness of 492 nm and a dielectric constant of 2.4 (see Table 2 below). FIG. 4 shows a thermogravimetric analysis of the film to demonstrate weight loss occurring during thermal treatments.

Example 1B

ATP was co-deposited with DEMS onto a silicon wafer via PECVD in an oxidant-free environment. The process conditions were 1300 miligrams per minute (mgm) flow of a 70% (by volume) mixture of alpha-terpinene in DEMS. A carrier gas flow of 500 sccm of $CO_2$ was used to entrain the chemicals into the gas flow into the deposition chamber. Further process conditions were as follows: a chamber pressure of 8 Torr, wafer chuck temperature of 200° C., showerhead to wafers spacing of 0.30 inches, and plasma power of 600 watts for a period of 120 seconds. The film as deposited had a thickness of 414 nm and a dielectric constant of 2.59. The film was annealed at 425° C. under nitrogen for 4 hours to remove substantially all the incorporated ATP. The annealed film had a thickness of 349 nm and a dielectric constant of 2.14 (see Table 2 below).

Example 1C

Figure 2:
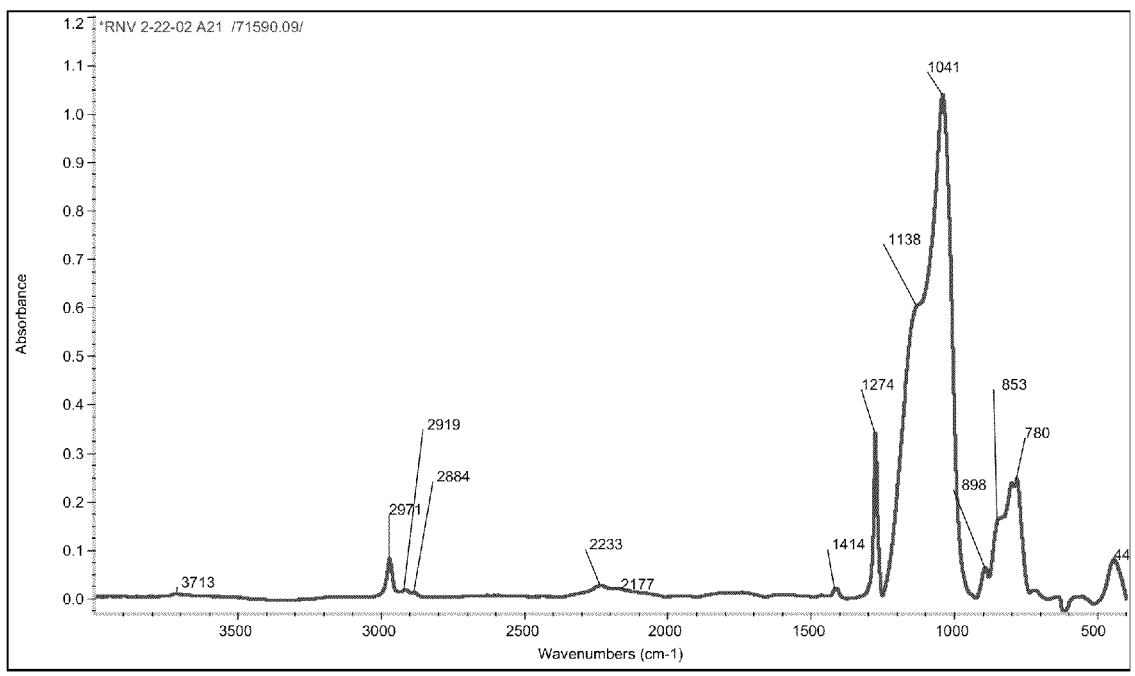
FIG. 2 is an infrared spectrum of the film of the present invention identifying the peaks of the components of the film.
Figure 3:
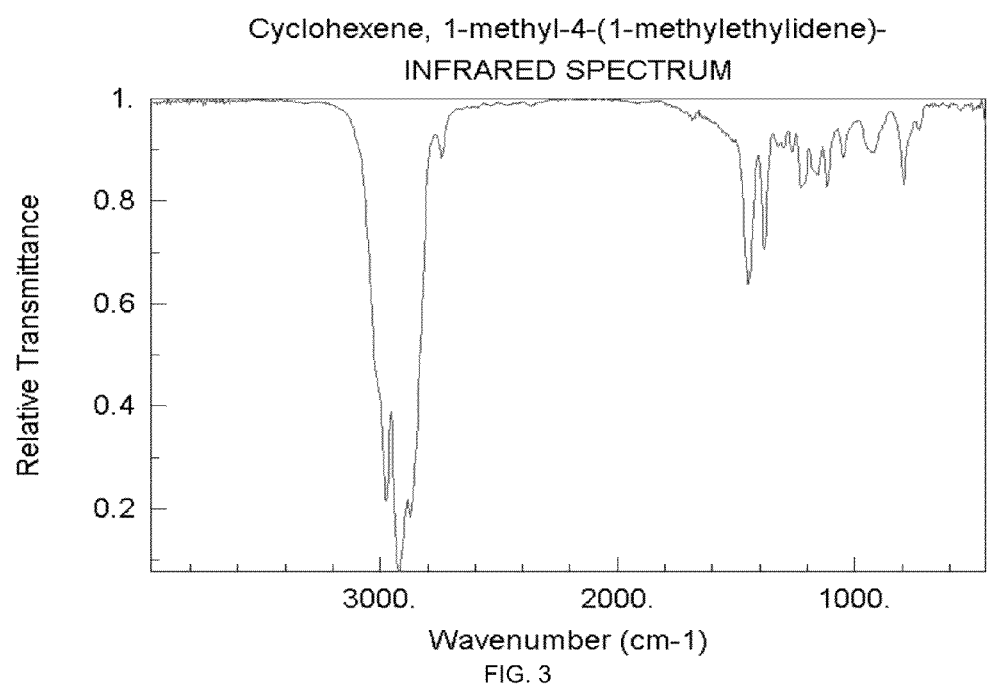
FIG. 3 is an infrared spectrum of ATP, a thermally labile group useful as a pore forming additive in the present invention.

A film was prepared and annealed substantially in accordance with Example 1A except that the anneal was conducted at a reduced temperature of 400° C. The infrared spectrum of the resulting film, including wavenumbers, is shown in FIG. 2. The infrared spectrum of the porogen, ATP, is shown in FIG. 3 for comparison.

Example 1D (Comparative)

A film was prepared and annealed substantially in accordance with Example 1A except that no porogens were used.

The film had a dielectric constant of 2.8, and a composition substantially identical to the annealed film of Example 1A (see Tables 1 and 2).

Example 1E (Comparative)

A film was prepared and annealed substantially in accordance with Example 1D except that the plasma power was 400 watts. The film had a dielectric constant of 2.8, and a composition substantially identical to the annealed film of Example 1A (see Tables 1 and 2).

Example 1F

A film was prepared and annealed substantially in accordance with Example 1A except that the process conditions were 1000 miligrams per minute (mgm) flow of a 75% (by volume) mixture of alpha-terpinene (ATP) in di-t-butoxymethylsilane (DtBOMS). A carrier gas flow of 500 sccm of $CO_2$ was used to escort the chemicals into the deposition chamber. Further process conditions were as follows: a chamber pressure of 7 Torr, wafer chuck temperature of 215° C., showerhead to wafers spacing of 0.30 inches, and plasma power of 400 watts for a period of 240 seconds. The film as deposited had a thickness of 540 nm and a dielectric constant of 2.8. The film was annealed at 425° C. under nitrogen for 4 hours to remove substantially all the incorporated alpha-terpinene. The annealed film had a thickness of 474 nm and a dielectric constant of 2.10. The modulus and hardness were 2.23 and 0.18 GPa, respectively.

Example 1G

ATP was co-deposited with DtBOMS onto a silicon wafer via PECVD in an oxidant-free environment. The process conditions were 700 miligrams per minute (mgm) flow of a 75% (by volume) mixture of ATP in DtBOMS. A carrier gas flow of 500 sccm of $CO_2$ was used to escort the chemicals into the deposition chamber. Further process conditions were as follows: a chamber pressure of 9 Torr, wafer chuck temperature of 275° C., showerhead to wafers spacing of 0.30 inches, and plasma power of 600 watts for a period of 240 seconds. The film as deposited had a thickness of 670 nm and a dielectric constant of 2.64. The film was annealed at 425° C. under nitrogen for 4 hours to remove substantially all the incorporated ATP. The annealed film had a thickness of 633 nm and a dielectric constant of 2.19. The modulus and hardness were 3.40 and 0.44 GPa, respectively.

Example 2

A third route investigated to produce low k films with k<2.6 was to physically mix an organosilicon precursor with a silica precursor having a large thermally labile group attached to it. To prove the efficacy of this route, fufuroxydimethylsilane was co-deposited with TMCTS at the following conditions; 1000 mgm flow of an 11% mixture of furfuroxydimethylsilane in TMCTS and a carrier gas flow of 500 sccm of He, a chamber pressure of 6 Torr, wafer chuck temperature of 150° C., showerhead to wafers spacing of 0.26 inches, and plasma power of 300 watts for a period of 40 seconds. Thickness of the as-deposited film was 1220 nm with a dielectric constant of 3.0. The inclusion of the furfuroxy was indicated by FTIR in the as-deposited films. After thermal post-treatments at 400° C. in nitrogen for 1 hour the k was reduced to 2.73. It is likely in this case that there was remaining a significant portion of the incorporated furfuroxy groups even after thermal anneal.

The preceding examples indicate the ability to incorporate a variety of functional groups into as-deposited films, and more critically the importance of the proper choice of the porogen to enable materials with k<2.6. A variety of other porogens can also function using these routes. To provide optimum low dielectric constant materials with k<2.6 requires good network-forming organosilane/organosiloxane precursors which can provide the proper type and amount of organic-group incorporation in the OSG network. It is preferred that network-forming precursors which do not require the addition of oxidant to produce OSG films be used. This is of particular importance when using hydrocarbon-based pore-forming precursors which are susceptible to oxidation. Oxidation may cause significant modification of the pore-former during deposition which could hamper its ability to be subsequently removed during annealing processes.

TABLE 1

XPS Data

| Example | Description | C | O | N | Si | Conditions |
|---|---|---|---|---|---|---|
| 1A | DEMS-ATP | 51.8 | 25.6 | ND | 22.6 | 150° C., 300 W |
| 1A | Annealed | 24.5 | 43.1 | ND | 32.4 | 425° C., 4 hrs. |
| 1E | DEMS | 28.8 | 38.8 | ND | 32.4 | 150° C., 400 W |
| 1E | Annealed | 25.1 | 41.4 | ND | 33.5 | 425° C., 4 hrs. |
| 1D | DEMS | 27.0 | 40.6 | ND | 32.4 | 150° C., 300 W |
| 1D | Annealed | 23.4 | 42.7 | ND | 33.9 | 425° C., 4 hrs. | all compositional analysis after 30 sec Ar sputter to clean surface; inherent measurement error +/− 2 atomic%.
Note:
Hydrogen cannot be determined by XPS; atomic compositions shown are normalized without hydrogen

TABLE 2

Film Property Data

| Example | Description | K | Refractive Index | Δ Thickness (%) | H (GPa) | M (GPa) |
|---|---|---|---|---|---|---|
| 1D; 1E | Various DEMS (as-deposited) | 2.9-3.1 | 1.435 | — | 0.30-0.47 | 2.4-3.5 |
| 1D; 1E | Various DEMS (post-treated) | 2.80 | 1.405 | 7-10 | — | — |
| 1A | DEMS-ATP (as-deposited) | 2.80 | 1.490 | — | — | — |
| 1A | DEMS-ATP(post-treated) | 2.41 | 1.346 | 22 | 0.36 | 3.2 |
| 1B | DEMS-ATP (as-deposited) | 2.59 | | — | — | — |
| 1B | DEMS-ATP (post-treated) | 2.14 | | 16 | | |
| 1F | DtBOMS-ATP (as-deposited) | 2.80 | 1.491 | — | — | — |
| 1F | DtBOMS-ATP (post-treated) | 2.10 | 1.315 | 12 | 0.18 | 2.2 |

TABLE 2-continued

Film Property Data

| Example | Description | K | Refractive Index | Δ Thickness (%) | H (GPa) | M (GPa) |
|---|---|---|---|---|---|---|
| 1G | DtBOMS-ATP (as-deposited) | 2.64 | 1.473 | — | — | — |
| 1G | DtBOMS-ATP (post-treated) | 2.19 | 1.334 | 5.5 | 0.44 | 3.4 |

Note:
all depositions performed at 150° C., hardness (H) and modulus (M) determined by nanoindentation.

Comparison of the IR spectrum of as-deposited and $N_2$ thermal post-treated DEMS/ATP films shows that thermal post-treatment in an inert atmosphere is successful for selective removal of porogen and retention of the OSG lattice. There is essentially no change in the Si—$CH_3$ absorption at 1275 $cm^{-1}$ after thermal anneal (the Si—$CH_3$ is associated with the OSG network). However, there is seen a dramatic reduction in C-H absorptions near 3000 $cm^{-1}$ suggesting that essentially all the carbon associated with ATP has been removed. The IR spectrum for ATP is shown for reference in FIG. 3. An added benefit of this anneal appears to be a significant reduction in the Si—H absorption at 2240 and 2170 $cm^{-1}$ which should render the film more hydrophobic. Thus, in certain embodiments of the invention, each Si atom of the film is bonded to not more than one H atom. However, in other embodiments, the number of H atoms bonded to Si atoms is not so limited.

Compositional analysis indicates that the DEMS-ATP film after anneal at 425° C. for 4 hrs (Example 1A) has essentially identical composition to a DEMS films deposited and annealed in the same manner (Example 1D). The DEMS-ATP film prior to anneal indicates a substantially larger amount of carbon-based material in the film (IR analysis supports that this carbon-based material is very similar to ATP—see FIG. 3). This supports the assertion that the porogen material incorporated into a DEMS film when co-deposited with ATP is essentially completely removed by the thermal post-treatment process. Thermogravimetric analysis (FIG. 4) further indicates that significant weight loss of the as-deposited material is experienced when heated to temperatures above 350° C., which is additional proof of porogen removal during annealing. The observed film shrinkage is likely caused by collapse of some portion of the OSG network upon removal of the porogen. However, there is little loss of organic groups from the OSG network, i.e., terminal methyl groups within the DEMS are mostly retained (see the XPS data of pre and post thermal treatment for DEMS film shown in Table 1). This is supported by the relatively equivalent Si—$CH_3$ bands at ~1275 wavenumbers in the IR spectrum. Hydrophobicity of this material is substantiated by the lack of Si—OH groups in the IR spectrum. The decrease in refractive index and dielectric constants of the films post-annealing suggests that they are less dense than the pre-annealed film, despite the decrease in film thickness. Positron Annihilation Lifetime Spectroscopy (PALS) indicates pore sizes for samples 1A, 1B, and 1F in the range of ~1.5 nm equivalent spherical diameter. Also, unlike the work of Grill et al (referenced in the introduction), analysis of the thickness loss in conjunction with the compositional change (Example 1A) indicates that the OSG network is retained during anneal and not significantly degraded.

Example 3

Improved Mechanical Properties/Cyclic Porogens

Several films were prepared in an Applied Materials Precision 5000 Platform as detailed above. UV treatments were performed with a fusion broad-band UV bulb. The mechanical properties of the porous films were measured by nanoindentation with an MTS AS-1 Nanoindentor.

Referring to Table 3, a DEMS/cyclooctane film with a dielectric constant of 2.5 has an enhanced modulus of greater than 35% relative to a DEMS/ATRP film having the same dielectric constant. Cyclooctane has no carbon-carbon double bonds and no pendant or branching structures, while alpha-terpinene has 2 carbon-carbon double bonds and is a branching structure with a methyl and a propyl group substituted on the carbon ring. The ionization energy of alpha-terpiene was calculated to be almost 2 eV lower than that of cyclooctane. It is believed that this allows more fragmentation of the organosilane precursor and ultimately leads to lower methyl incorporation into the OSG network.

TABLE 3

| Porogen | Unsaturation | Branched or Non-branched | Cyclic or Non-Cyclic | Dielectric Constant | Hardness | Modulus Gpa | Si—CH3/Si—O FT-IR | Ionization Energy |
|---|---|---|---|---|---|---|---|---|
| Cyclooctane | 1 | Non-branched | Cyclic | 2.5 | 1.53 | 10.8 | 1.2% | 8.92 eV |
| Norbornadiene | 4 | Non-branched | Cyclic | 2.5 | 1.07 | 7.1 | 2.0% | 7.93 eV |
| Dimethylhexadiene | 2 | Branch | Non | 2.5 | | 7.9 | 1.7% | 7.12 eV |
| Alpha-Terpinene | 3 | Branch | Cyclic | 2.5 | 0.95 | 6.6 | 2.0% | 7.00 eV |
| Limonene | 3 | Branch | Cyclic | 2.5 | 1.1 | 7.8 | 1.7% | 7.62 eV |

Referring now to Table 4, experiments were also performed for DEMS mixed with porogen precursors where the number of carbons per molecule was held constant. The data show that a cyclic, nonbranched structure with low degree of unsaturation is the preferred porogen precursor to produce a high mechanical strength film. The film produced by isooctane, which is non-cyclic and branched, results in the lowest hardness value. The film produced by cyclooctane, which is cyclic, nonbranched, and has one degree of saturation, results in the highest hardness value.

TABLE 4

| Porogen | Unsaturation | Branched or Nonbranched | Cyclic or NonCyclic | Dielectric Constant | Hardness |
|---|---|---|---|---|---|
| cyclooctane | 1 | Nonbranched | Cyclic | 2.2 | 1.0 |
| iso-octane | 1 | Branched | Noncyclic | 2.2 | 0.2 |
| Cyclo-octene | 2 | Nonbranched | Cyclic | 2.3 | 0.8 |

Referring to Table 5, the listed porogen precursors were employed to create films having dielectric constants of between 2.27 and 2.46. At comparable dielectric constants between 2.26 and 2.27, DEMS films employing 1,5-cyclooctadiene as a precursor (3 degrees of unsaturation) have 40% higher modulus than films using methylcyclopentadiene-dimer as a precursor (5 degrees of unsaturation). At comparable dielectric constants between 2.41 and 2.46, DEMS films employing cycloheptane (one degree of unsaturation) have 9% higher modulus than films using vinylcyclohexane (two degrees of unsaturation).

TABLE 5

| Porogen | Porogen: (DEMS+ Porogen) Ratio | Power [Watt] | Gap [Mil] | Pressure [Torr] | Temp [C.] | Liquid flow [mg/min] | $CO_2$ flow sccm | $O_2$ flow sccm |
|---|---|---|---|---|---|---|---|---|
| Cyclooctene | 80% | 500 | 350 | 8 | 275 | 800 | 200 | 20 |
| 1,5-Cycloactadiene | 70% | 400 | 350 | 8 | 275 | 800 | 200 | 20 |
| Cycloheptane | 90% | 600 | 350 | 8 | 275 | 800 | 200 | 20 |
| Vinylcyclohexane | 80% | 600 | 350 | 8 | 275 | 800 | 200 | 20 |
| Methylcyclopentadiene Dimer | 70% | 600 | 350 | 8 | 275 | 600 | 200 | 20 |

| Porogen | Dieletric Constant | Degree Unsat. | Modulus [GPa] | Shrinkage [%] | Dep Rate |
|---|---|---|---|---|---|
| Cyclooctene | 2.32 | 2 | 5.8 | 14 | 360 |
| 1,5-Cyclooctadiene | 2.27 | 3 | 3.7 | 22 | 451 |
| Cycloheptane | 2.41 | 1 | 7.3 | 10 | 212 |
| Vinylcyclohexane | 2.46 | 2 | 6.7 | 16 | 330 |
| Methylcyclopentadiene Dimer | 2.26 | 5 | 2.6 | 21 | 762 |

Example 4

Film Characterization

Figure 5:
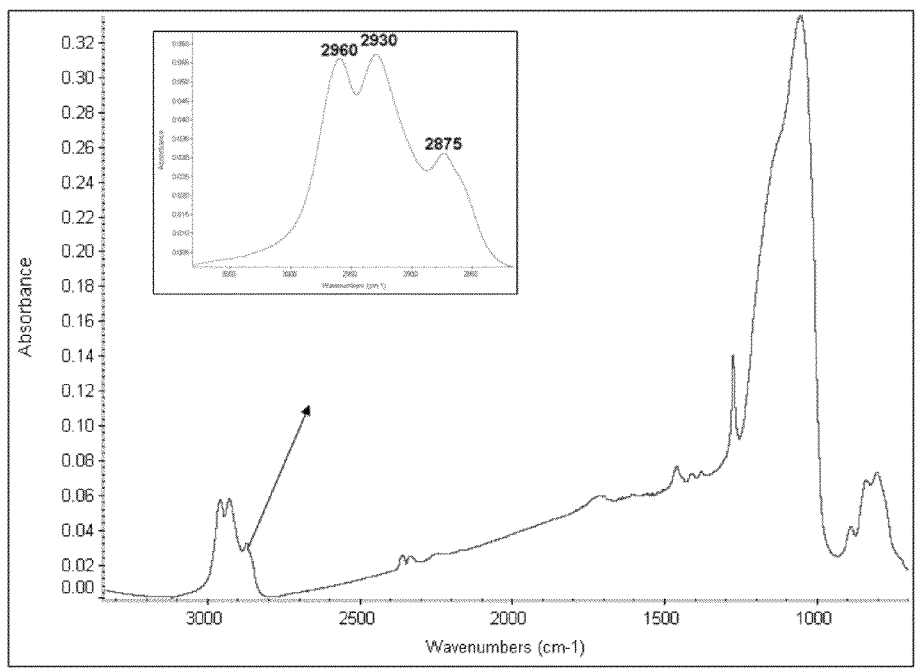
FIG. 5 is an infrared spectrum of a composite film according to the present invention before porogen removal.
Figure 6:
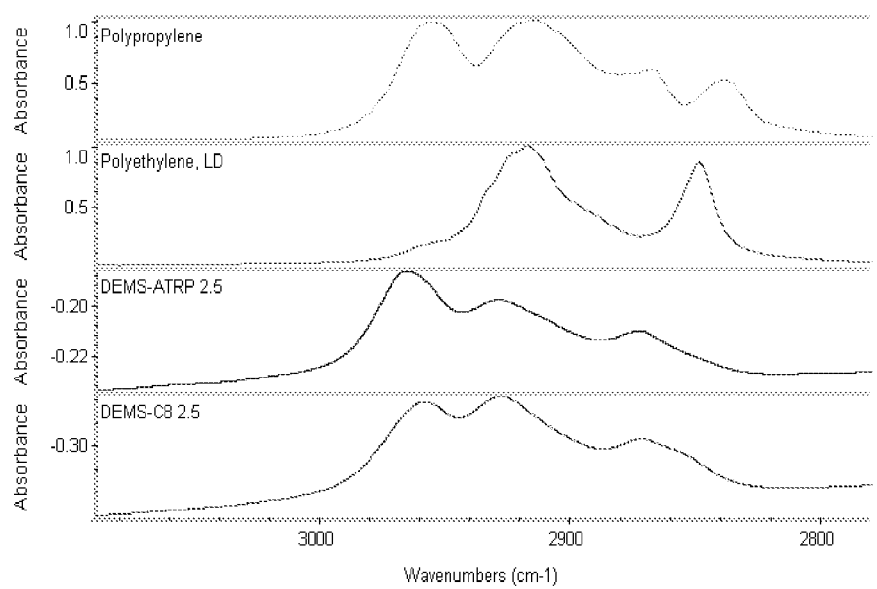
FIG. 6 illustrates comparative infrared spectra of composite films according to the present invention and polyethylene.
Figure 7:
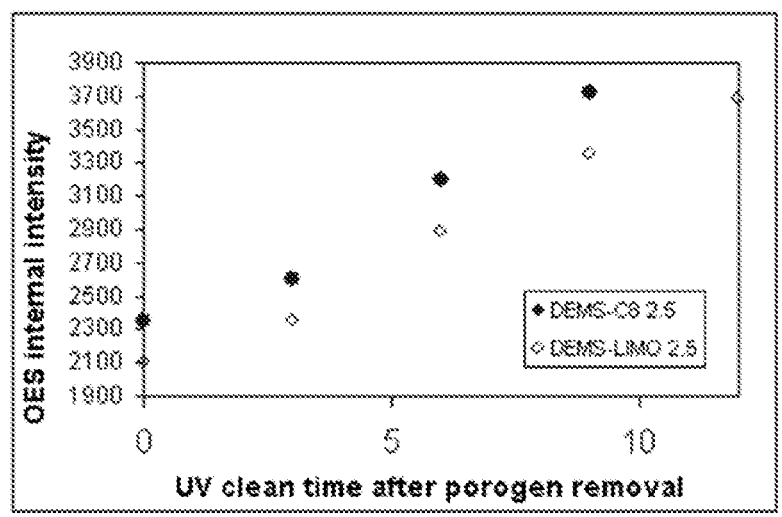
FIG. 7 illustrates the beneficial chamber cleaning when preferred porogens according to the present invention are employed.

Referring to FIG. 5, the as-deposited porogen structure is characterized by adsorptions in the 3100-2800 $cm^{-1}$ wave number range with an FT-IR. The peak centered at approx 2960 $cm^{-1}$ is attributed to —$CH_3$ stretching modes, whereas the peak centered at approx 2930 $cm^{-1}$ is attributed to —$CH_2$ stretching modes. Referring to FIG. 6, the cyclic, unbranched porogen precursor results in a more polyethylene —$CH_2$-like porogen in the composite film. FIG. 5 shows that for this material, the peak centered at 2930 $cm^{-1}$ is at a greater height than that centered at 2960 $cm^{-1}$. Without wishing to be bound by a particular theory, it is believed that the polyethylene-like organic material that is deposited from cyclooctane (and other preferred porogens) may be easier to remove from the film and result in less build up of light absorbing residues (e.g., unsaturated, conjugated, aromatic carbon) inside the curing chamber. Applicants have surprisingly discovered that this effect reduces the time needed to clean the deposition and UV cure chamber and improve overall throughput. For example, referring to FIG. 7 it is evident that a cyclic, unbranched, unsaturated porogen precursor blocks less of the UV signal at 269 nm after porogen removal than do other porogens. Reduced clean times after the curing process necessary for films of the former type were also observed. In FIG. 7, the effluent residue from cyclooctane (cyclic, unbranched precursor with 1 degree of saturation) blocks less UV intensity on the chamber window and results in a shorter chamber clean time compared to limonene (cyclic, branched, with 3 degrees of unsaturation).

Figure 8:
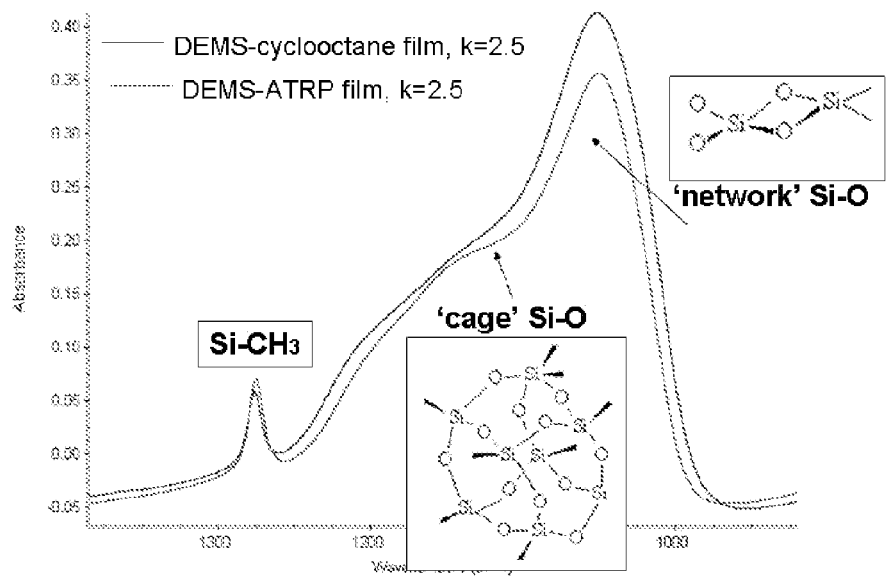
FIG. 8 illustrates comparative infrared spectra of composite films according to the present invention.
Figure 9:
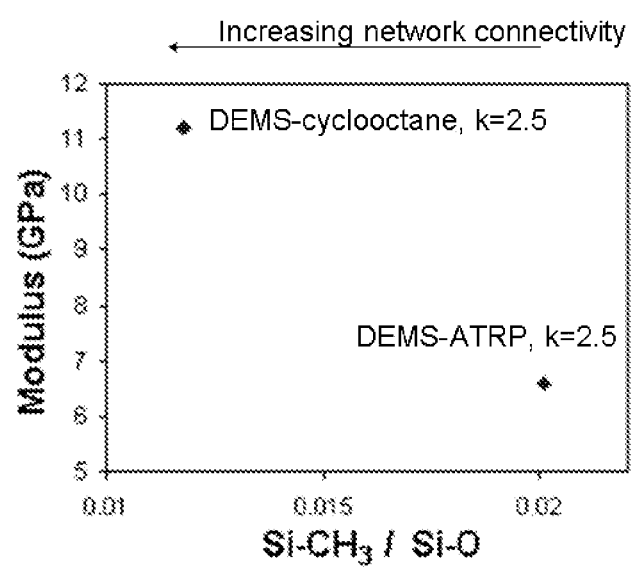
FIG. 9 illustrates certain mechanical properties of films according to the present invention.
Figure 10:
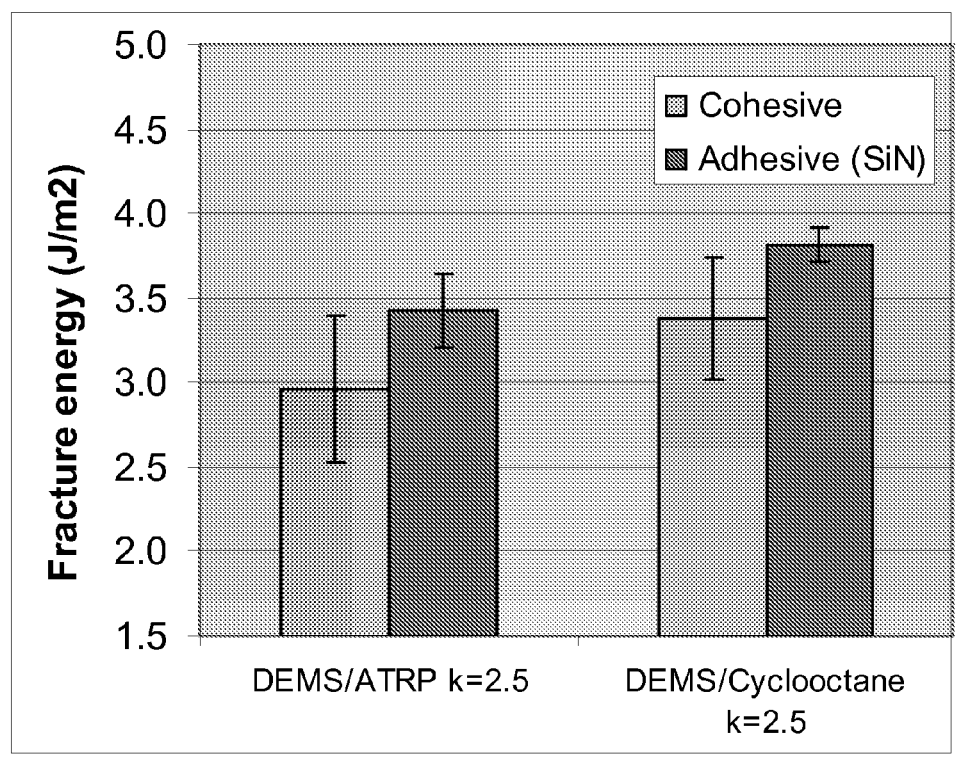
FIG. 10 illustrates certain mechanical properties of films according to the present invention.

Referring now to FIGS. 8, 9 and 10, the present inventors observed that, by employing a cyclic unbranched porogen precursor with a low degree of un-saturation, a lower silicon-methyl incorporation in the film porous film results. The ratio of this Si—$CH_3$/Si—O species is a measure of the network connectivity of the film, and has been shown to be directly related to the film modulus and to the adhesion to adjacent barrier layers. Without wishing to be bound by a particular theory, it is believed that this class of porogens enables the formation of more robust organosilicate networks in the resulting film.

Example 5

For films 5-A and 5-B, 1,3-disilabutane was co-deposited with cyclooctane onto a silicon wafer via PECVD. 200 sccm of $CO_2$ were used to escort the chemicals into the deposition chamber in addition to 10 sccm of $O_2$. The films were cured by exposure to broad band UV radiation under 1-20 torr of flowing helium. Relative chemical concentrations in Table 6 were estimated using FT-IR peak areas. Data was integrated from the following wave number ranges: $SiCH_3$ (1250-1300 $cm^{-1}$), Si—$CH_2$—Si (1340-1385 $cm^{-1}$), Si—O (950-1250 $cm^{-1}$).

Figure 11:
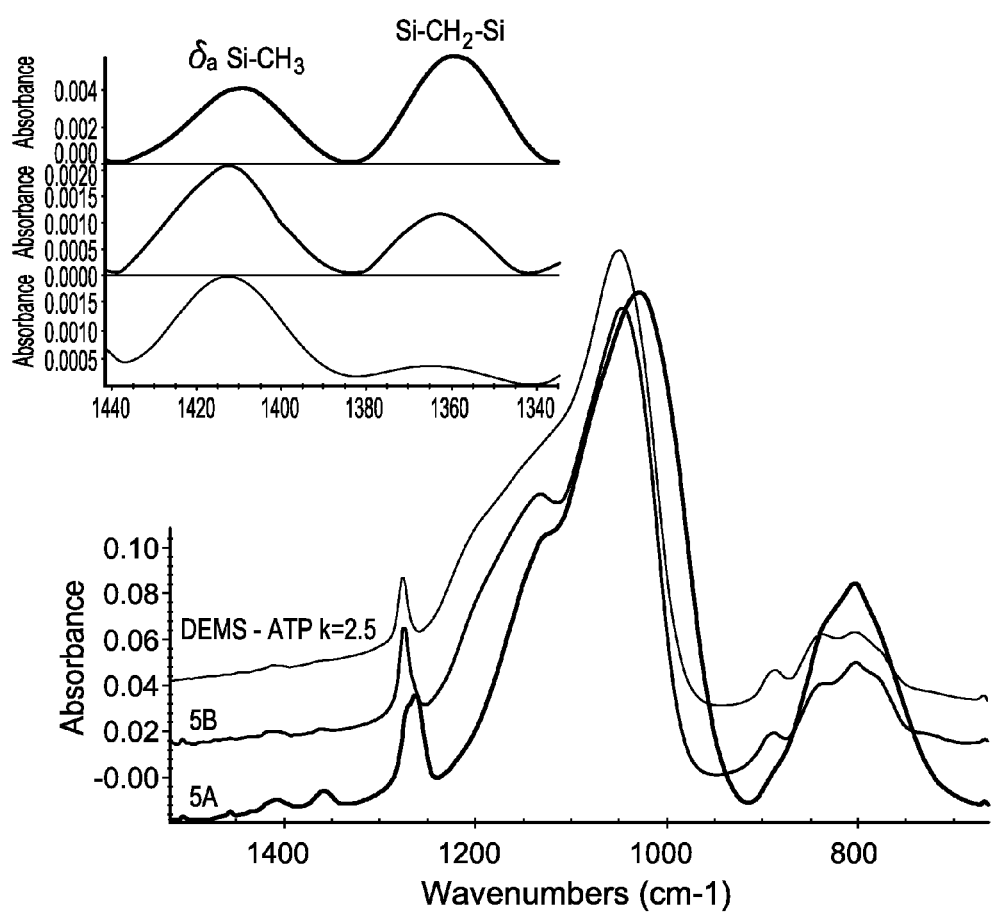
FIG. 11 is an infrared (FT-IR) spectra of a film according to an embodiment of the invention.

As shown in FIG. 11, films 5-A and 5-B have an increased FT-IR signal in the 1360 $cm^{-1}$ range, which is indicative of enhancement in Si—$CH_2$—Si type species. Furthermore, Table 6 demonstrates that films 5-A and 5-B contain an order of magnitude greater methylene to SiO ratio than films deposited using diethoxymethylsilane (DEMS) and alpha-terpinene (ATP).

TABLE 6

| | Dielectric constant | Si—CH$_3$/Si—O | Si—CH$_2$—Si/Si—O |
|---|---|---|---|
| DEMS-ATP | 2.50 | 0.016 | 1E−4 |
| 5-A | 2.54 | 0.020 | 1E−3 |
| 5-B | 2.78 | 0.042 | 5E−3 |

Example 6

For films 6A-6D, bis-triethoxysilylmethane was co-deposited with cyclooctane onto a silicon wafer via PECVD. 200 sccm of CO$_2$ were employed to escort the chemicals into the deposition chamber in addition to 20 sccm of O$_2$. The films were cured by exposure to broad band UV radiation under 1-20 torr of flowing helium. Mechanical properties and dielectric constants are shown in Table 7, where a modulus of 2.85 GPa was reached for a film with dielectric constant of 1.92, using this chemical combination and preferred porogen.

TABLE 7

| Film | Thickness (nm) | refractive index | dielectric constant | Modulus Gpa |
|---|---|---|---|---|
| 6A | 645 | 1.26 | 2.00 | 2.90 |
| 6B | 630 | 1.27 | 1.92 | 2.85 |
| 6C | 586 | 1.36 | 2.15 | 3.30 |
| 6D | 895 | 1.34 | 2.33 | 8.96 |

The present invention has been set forth with regard to several preferred embodiments, but the scope of the present invention is considered to be broader than those embodiments and should be ascertained from the claims below.

The invention claimed is:

1. A chemical vapor deposition method for producing a porous organosilica glass film represented by the formula $Si_vO_wC_xH_yF_z$, where v+w+x+y+z=100%, v is from 10 to 35 atomic %, w is from 10 to 65 atomic %, x is from 5 to 30 atomic %, y is from 10 to 50 atomic % and z is from 0 to 15 atomic %, said method comprising:
providing a substrate within a vacuum chamber;
introducing into the vacuum chamber gaseous reagents including at least one precursor selected from the group consisting of an organosilane and an organosiloxane, and a porogen that is distinct from the precursor, wherein the porogen is a C$_4$ to C$_{14}$ cyclic hydrocarbon compound having a non-branching structure and a degree of unsaturation equal to or less than 2;
applying energy to the gaseous reagents in the vacuum chamber to induce reaction of the gaseous reagents to deposit a preliminary film on the substrate, wherein the preliminary film contains the porogen; and
removing from the preliminary film substantially all of the labile organic material to provide the porous film with pores and a dielectric constant less than 2.6.

2. The method of claim 1 wherein the dielectric constant is less than 2.2.

3. The method of claim 1 wherein v is from 20 to 30 atomic %, w is from 20 to 45 atomic %, x is from 5 to 20 atomic %, y is from 15 to 40 atomic % and z is 0.

4. The method of claim 1 wherein the energy is plasma energy and the porogen is removed by exposure to ultraviolet radiation.

5. The method of claim 1 wherein most of the hydrogen in the porous film is bonded to carbon.

6. The method of claim 1 wherein the porous film has a density less than 1.5 g/ml.

7. The method of claim 1 wherein the pores have an equivalent spherical diameter less than or equal to 5 nm.

8. The method of claim 1 wherein a Fourier transform infrared (FTIR) spectrum of the porous film is substantially identical to a reference FTIR of a reference film prepared by a process substantially identical to the method except for a lack of porogen precursor.

9. The method of claim 1 wherein the porous film has an average weight loss of less than 1.0wt % /hr isothermal at 425° C. under N$_2$.

10. The method of claim 1 wherein the porous film has an average weight loss of less than 1.0wt % /hr isothermal at 425° C. under air.

11. The method of claim 1 wherein the porogen is a C$_7$ to C$_{10}$ cyclic hydrocarbon compound.

12. The method of claim 11 wherein the porogen is selected from the group consisting of: cyclooctane, cycloheptane, cyclooctene, cycloheptene, and mixtures thereof.

13. The method of claim 11 wherein the porogen is a C$_8$ cyclic hydrocarbon compound.

14. The method of claim 13 wherein the porogen is selected from the group consisting of: cyclooctane, cyclooctene, and mixtures thereof.

15. The method of claim 14 wherein the porogen is cyclooctane.

16. The method of claim 1, wherein the organosiloxane is diethoxymethylsilane (DEMS).

17. The method of claim 13, wherein the at least one precursor is represented by:
(a) the formula $R^1_n(OR^2)_p(O(O)CR^3)_{4-(n+p)}Si$ where $R^1$ is independently H or C$_1$ to C$_4$ linear or branched, saturated, singly or multiply unsaturated, cyclic, partially or fully fluorinated hydrocarbon; $R^2$ is independently C$_1$ to C$_6$ linear or branched, saturated, singly or multiply unsaturated, cyclic, aromatic, partially or fully fluorinated hydrocarbon, $R^3$ is independently H, C$_1$ to C$_6$ linear or branched, saturated, singly or multiply unsaturated, cyclic, aromatic, partially or fully fluorinated hydrocarbon, n is 1 to 3 and p is 0 to 3;
(b) the formula $R^1_n(OR^2)_p(O(O)CR^4)_{3-n-p}Si$—O—$SiR^3_m(O(O)CR^5)_{q\,(OR^6)_{3-m-q}}$ where $R^1$ and $R^3$ are independently H or C$_1$ to C$_4$ linear or branched, saturated, singly or multiply unsaturated, cyclic, partially or fully fluorinated hydrocarbon; $R^2$ and $R^6$ are independently C$_1$ to C$_6$ linear or branched, saturated, singly or multiply unsaturated, cyclic, aromatic, partially or fully fluorinated hydrocarbon, $R^4$ and $R^5$ are independently H, C$_1$ to C$_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≥1, n+p≤3 and m+q≤3;
(c) the formula $R^1_n(OR^2)_p(O(O)CR^4)_{3-n-p}Si$—$SiR^3_m(O(O)CR^5)_{q\,(OR^6)_{3-m-q}}$ where $R^1$ and $R^3$ are independently H or C$_1$ to C$_4$ linear or branched, saturated, singly or multiply unsaturated, cyclic, partially or fully fluorinated hydrocarbon; $R^2$ and $R^6$ are independently C$_1$ to C$_6$ linear or branched, saturated, singly or multiply unsaturated, cyclic, aromatic, partially or fully fluorinated hydrocarbon, $R^4$ and $R^5$ are independently H, C$_1$ to C$_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m ≥1, n+p≤3 and m+q ≤3;
(d) the formula $R^1_n(OR^2)_p(O(O)CR^4)_{3-n-p}Si$—$R^7$—$SiR^3_m(O(O)CR^5)_{q(OR^6)_{3-m-q}}$ where $R^1$ and $R^3$ are independently H or $C_1$ to $C_4$ linear or branched, saturated, singly or multiply unsaturated, cyclic, partially or fully fluorinated hydrocarbon; $R^2$, $R^6$ and $R^7$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m ≥1, n+p≤3, and m+q≤3;

(e) the formula $(R^1_n(OR^2)_p(O(O)CR^3)_{4-(n+p)Si})_t CH_{4-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3, and t is 2 to 4, provided that n+p≤4;

(f) the formula $(R^1_n(OR^2)_p(O(O)CR^3)_{4-(n+p)}Si)_t NH_{3+t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3 and t is 1 to 3, provided that n+p≤4; or (g) cyclic carbosilanes of the formula $(CR_1R_3SiR_1R_3)_x$, where $R^1$ and $R^3$ are independently H, $C_1$ to $C_4$, linear or branched, saturated, singly or multiply unsaturated, cyclic, partially or fully fluorinated, and x is an integer from 2 to 8.

18. The method of claim 14, wherein the at least one precursor is a member selected from the group consisting of diethoxymethylsilane, dimethoxymethylsilane, di-isopropoxymethylsilane, di-t-butoxymethylsilane, methyltriethoxysilane, methyltrimethoxysilane, methyltri-isopropoxysilane, methyltri-t-butoxysilane, dimethyldimethoxysilane, dimethyldiethoxysilane, dimethyldi-isopropoxysilane, dimethyldi-t-butoxysilane, and tetraethoxysilane.

19. The method of claim 1, wherein said at least one precursor is a mixture of a first organosilicon precursor with two or fewer Si—O bonds with a second organosilicon precursor with three or more Si—O bonds, and the mixture is provided to tailor a chemical composition of the porous film.

20. The method of claim 1 wherein the gaseous reagents include a mixture of diethoxymethylsilane and tetraethoxysilane.

* * * * *